(12) United States Patent
Nakajima et al.

(10) Patent No.: US 8,183,552 B2
(45) Date of Patent: May 22, 2012

(54) SEMICONDUCTOR MEMORY DEVICE

(75) Inventors: Shingo Nakajima, Kanagawa-ken (JP); Eiji Ito, Kanagawa-ken (JP); Mitsuhiro Noguchi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 358 days.

(21) Appl. No.: 12/540,896

(22) Filed: Aug. 13, 2009

(65) Prior Publication Data
US 2010/0038617 A1 Feb. 18, 2010

(30) Foreign Application Priority Data

Aug. 13, 2008 (JP) ................................. 2008-208648
Mar. 13, 2009 (JP) ................................. 2009-060933

(51) Int. Cl.
*H01L 29/02* (2006.01)
(52) U.S. Cl. ................ 257/2; 257/5; 257/326; 257/751; 257/E27.078; 438/627; 438/643; 438/653
(58) Field of Classification Search .................. None
See application file for complete search history.

(56) References Cited

U.S. PATENT DOCUMENTS

| 6,169,688 | B1 | 1/2001 | Noguchi | |
|---|---|---|---|---|
| 2009/0283739 | A1* | 11/2009 | Kiyotoshi | 257/4 |
| 2009/0294751 | A1* | 12/2009 | Kiyotoshi | 257/4 |
| 2011/0006392 | A1* | 1/2011 | Kono et al. | 257/529 |

FOREIGN PATENT DOCUMENTS

JP 8-55908 2/1996
* cited by examiner

*Primary Examiner* — Evan Pert
*Assistant Examiner* — Scott R Wilson
(74) *Attorney, Agent, or Firm* — Oblon, Spivak, McClelland, Maier & Neustadt, L.L.P.

(57) ABSTRACT

A semiconductor memory device having a first wiring layer which is provided on a first insulator, and which extends in a first direction, and a non-volatile memory cell which is provided in a pillar shape on the first wiring layer, and which includes a non-ohmic element and variable resistance element connected in series. The resistance value of the variable resistance element changes in accordance with a voltage or current applied thereto. A barrier layer is provided on the memory cell and is configured in an in-plane direction. A conductive layer is provided on the barrier layer and is configured in an in-plane direction. A second insulator is provided on the first insulator and covers side surfaces of the memory cell, the barrier layer, and the conductive layer. A second wiring layer is provided on the conductive layer and extends in a second direction.

14 Claims, 36 Drawing Sheets

(a) Schottky Structure (d) MIM Structure (b) PN Structure (e) SIS Structure (c) PIN Structure

SEMICONDUCTOR MEMORY DEVICE

CROSS-REFERENCE TO RELATED APPLICATION

This application is based upon and claims the benefit of priority from the prior Japanese Patent Application No. 2008-208648, filed on Aug. 13, 2008, the entire contents of which are incorporated herein by reference.

BACKGROUND OF THE INVENTION

1. Field of the Invention

The present invention, relating to a non-volatile semiconductor memory device and a manufacturing method thereof, relates to, for example, a non-volatile semiconductor memory device and a manufacturing method thereof including a non-volatile memory cell which stores information in accordance with a change in resistance.

2. Description of the Related Art

To date, a flash memory configuring a memory cell array by an NAND connection or an NOR connection of memory cells having a floating gate structure has been known as an electrically rewritable non-volatile semiconductor memory. Also, a ferroelectric memory has also been known as a non-volatile semiconductor memory of which a high speed random access is possible.

Meanwhile, a resistance variation type memory using a variable resistance element in a memory cell has been proposed as a technology for achieving a further miniaturization of a memory cell. A phase change memory element which causes a resistance value to change in accordance with a change in state of a chalcogenide chemical compound between crystalline and amorphous, a magnetic tunnel junction (MTJ) element utilizing a tunneling-magnetoresistive (TMR) effect, a polymer ferroelectric RAM (PFRAM) in which the variable resistance element is formed of a conductive polymer, an ReRAM element which brings about a resistance change by an application of an electric pulse, and the like, have been known as the variable resistance element.

As it is possible, with this kind of resistance variation type memory, to configure a memory cell by connecting a diode and variable resistance element in series in place of a transistor, it is possible to employ a crosspoint structure wherein a memory cell is disposed in an area in which upper and lower wirings intersect. For this reason, it has an advantage in that a further high integration may be achieved (Patent Document: JP-T-2005-522045).

DETAILED DESCRIPTION OF THE INVENTION

First Embodiment

Figure 1:
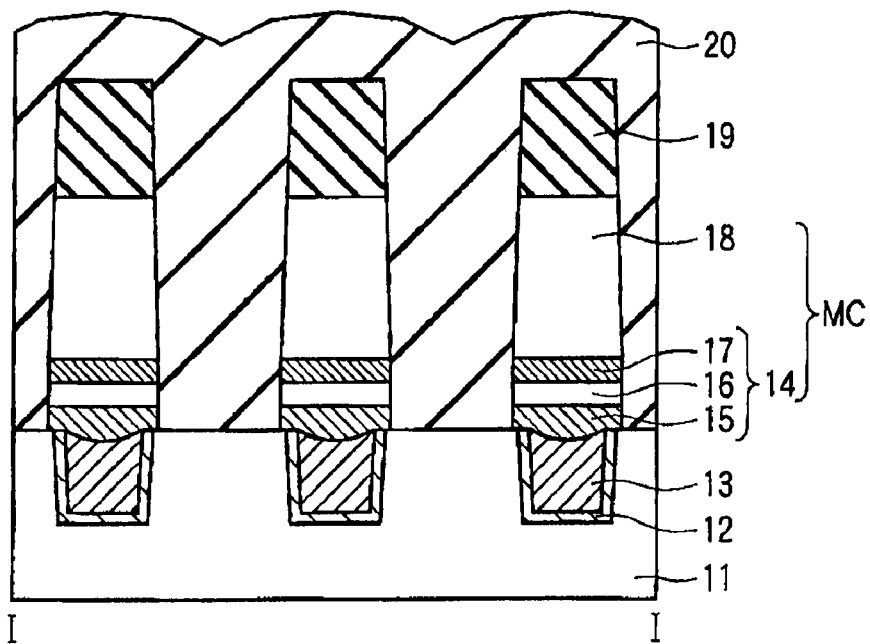
FIG. 1 is a sectional view showing a manufacturing process of a resistance variation type memory according to a comparison example.

A first embodiment of the invention will now be described with reference to the drawings. In the following description, identical reference numerals and characters will be given to elements having identical functions and configurations, and a duplicated description will be given only in a necessary case.

Considerations Leading to Invention

Figure 5:
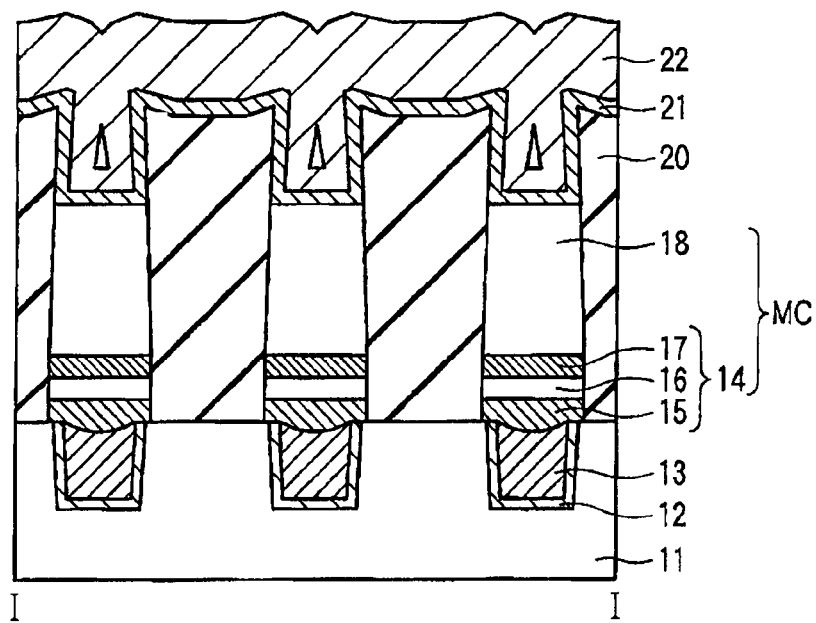
FIG. 5 is a sectional view showing a manufacturing process of a resistance variation type memory according to a comparison example.
Figure 6:
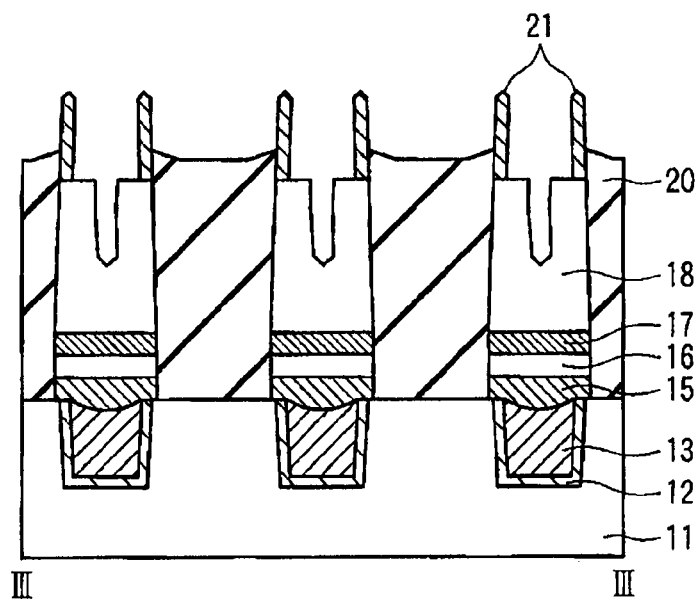
FIG. 6 is a sectional view showing a manufacturing process of a resistance variation type memory according to a comparison example.
Figure 7:
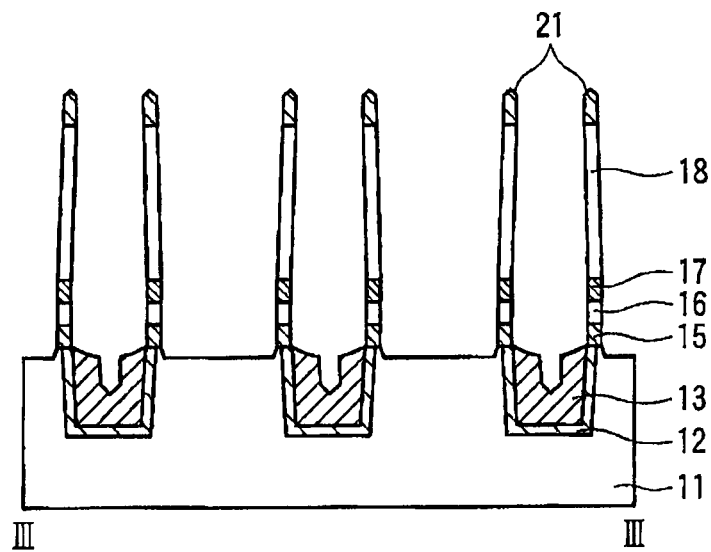
FIG. 7 is a sectional view showing a manufacturing process of a resistance variation type memory according to a comparison example.
Figure 8:
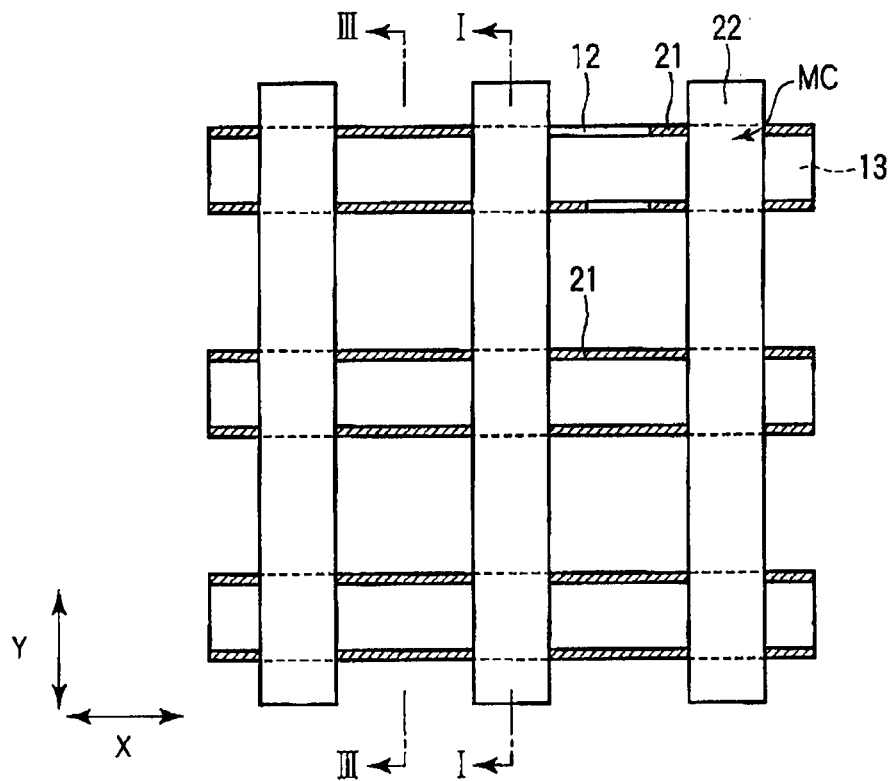
FIG. 8 is a plain view showing a manufacturing process of a resistance variation type memory according to a comparison example.

FIGS. 1 to 7 are sectional views showing a manufacturing process of a resistance variation type memory according to a comparison example. FIG. 8 is a plain plane view showing a manufacturing process of a resistance variation type memory according to a comparison example. FIGS. 1 to 5 are sectional views showing the configuration of a resistance variation type memory along a line I-I shown in FIG. 8, FIGS. 6 to 7 are sectional views showing the configuration of a resistance variation type memory along a line III-III shown in FIG. 8.

As shown in FIG. 1, an interlayer insulator 11 made of, for example, silicon oxide is deposited on an optional level layer formed on, for example, a silicon single-crystal substrate (not shown). Next, a plurality of first wiring layers (bit lines) 13 are formed inside the interlayer insulator 11, using the damascene method. That is, a plurality of grooves in which the first wiring layers 13 are to be formed are formed in the interlayer insulator 11. Next, barrier metals 12, and the first wiring layers 13, are deposited in order in the grooves, and the barrier metals 12 and first wiring layers 13 are polished and planarized using a chemical mechanical polishing (CMP)

method, in such a way as to leave only the portions in the grooves. By this means, the plurality of linear first wiring layers 13, each extending in an X direction, are formed in the interlayer insulator 11. For example, tungsten is used as the first wiring layers 13.

Next, a lower electrode 15, recording layer 16, and upper electrode 17, which configure a variable resistance element 14, are deposited in order on the first wiring layers 13. Next, after depositing a diode 18 configured of, for example, a silicon semiconductor, on the variable resistance element 14, an insulator stopper layer 19 made of, for example, silicon oxynitride or silicon nitride, which functions as a CMP stopper and lithography mask material, is deposited on the diode 18.

Next, the membranes 19, 18, 17, 16, and 15 are etched using a lithography and anisotropic reactive ion etching (RIE) method, in such a way that laminated membranes with the same pattern as the first wiring layers 13 remain. Next, an insulator 20 made of, for example, silicon oxide is deposited over the whole of the sample, obtaining the structure of FIG. 1. At this time, in order to arrange in such a way that, from a characteristic of the ion etching, ions reach an etching surface directly from an upper portion of the pattern, thereby obtaining a good etching shape with no bowing, and in order to arrange in such a way that no void or seam occurs in the insulator 20, the side walls of the membranes 19, 18, 17, 16, and 15 are processed into a forward taper.

Figure 2:
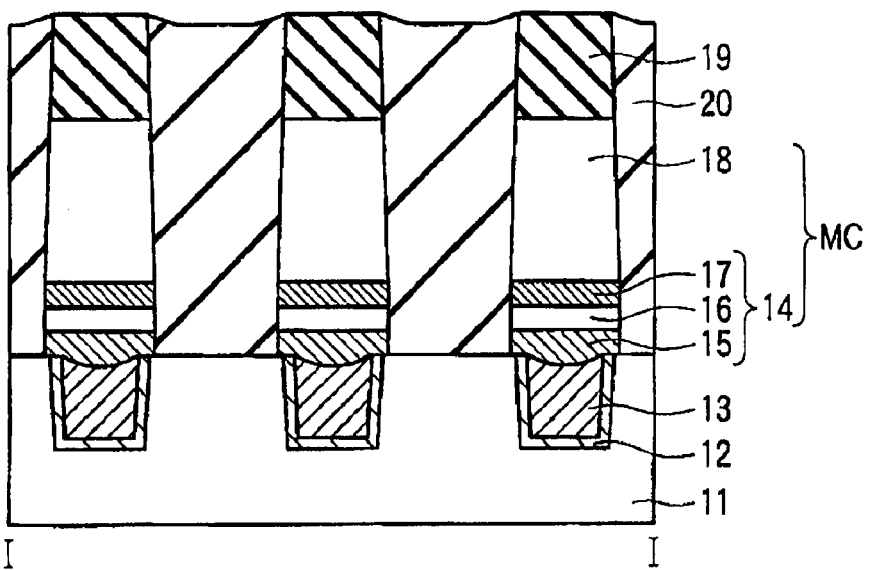
FIG. 2 is a sectional view showing a manufacturing process of a resistance variation type memory according to a comparison example.
Figure 3:
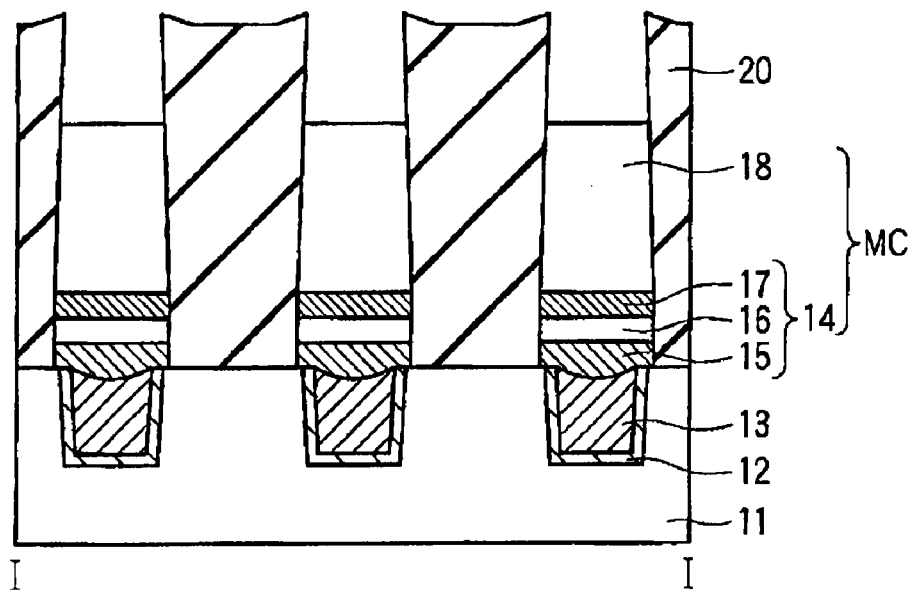
FIG. 3 is a sectional view showing a manufacturing process of a resistance variation type memory according to a comparison example.
Figure 4:
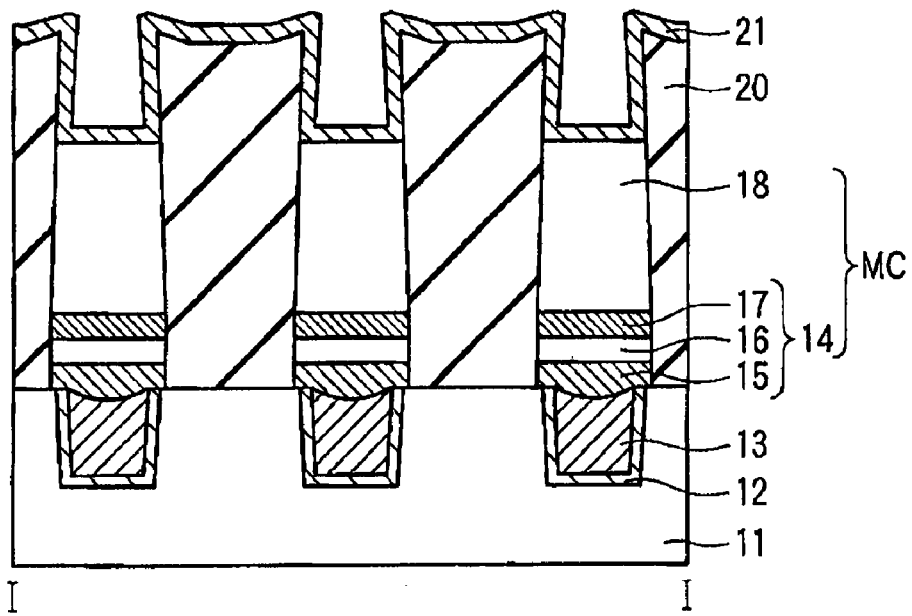
FIG. 4 is a sectional view showing a manufacturing process of a resistance variation type memory according to a comparison example.

Next, the top surface of the insulator 20 is planarized, using the CMP method using the stopper layer 19 as a stopper, obtaining the structure of FIG. 2. By means of the CMP process, a so-called dishing form results wherein the height of a central portion of the insulator 20 is slightly less than that of the stopper layer 19, as shown in FIG. 2. Next, a stripping of the stopper layer 19 is carried out using, for example, a phosphoric acid solution, obtaining the structure of FIG. 3.

In the case of the diode 18 formed of a silicon semiconductor, on tungsten or copper, which are low resistance metals formed later, diffusing, they form a deep level and become a carrier trapping level, whereon a rectifying property of the diode 18 deteriorates. For this reason, before a second wiring layer 22 is deposited, for example, titanium nitride or titanium, forming a barrier metal 21, is deposited to a thickness of, for example, 2 to 20 nm in grooves (areas in which the stopper layer 19 had been formed) on the diode 18.

Next, by depositing, for example, tungsten as the second wiring layer 22 over the whole of the sample, the structure of FIG. 5 is obtained. In this case, as the side walls of the stopper layer 19 had been in a forward taper, the side walls of the barrier metal 21 are in a reverse taper, and grooves which narrow toward the top are formed in the portions from which the stopper layer 19 had been stripped. For this reason, a problem occurs in that a void is liable to be formed in the second wiring layer 22, as shown in FIG. 5. In the event that this kind of void is formed, a problem wherein a wiring resistance increases, and a problem wherein, as the second wiring layer 22 is segmentalized by the void, and the barrier metal 21, whose resistivity is higher than that of the second wiring layer 22, is formed on the side walls, a current concentrates in one portion of the second wiring layer 22, and the reliability of the wiring declines.

Next, the second wiring layer 22 is processed, using the lithography and anisotropic RIE method, in order to form a second wiring layer 22 which has a pattern perpendicular to the first wiring layer 13, as shown in FIG. 6. By this means, a plurality of linear second wiring layers 22, each extending in a Y direction, are formed on the barrier metal 21, as shown in FIG. 8.

Herein, as shown in FIG. 6, as the barrier metal 21 uses a material which is more difficult to etch than the wiring material, the barrier metal 21 remains in sheer side walls. This is a problem which occurs because the stopper layer 19 is formed in a forward taper, and the barrier metal 21 is formed in the grooves from which the stopper layer 19 has been stripped. Furthermore, in the event that a void is formed in the second wiring layer 22, as the amount of the second wiring layer 22 is small in the void portion, the etching proceeds in a corresponding portion under the void, and a groove is formed in the diode 18, as shown in FIG. 6.

Next, in order to process a memory cell MC, including the variable resistance element 14 and diode 18, into a desired shape, and to separate it into a plurality of memory cells in the X direction, the linear laminated membranes are etched using the RIE method. A process sectional view of a case in which this etching has been performed is shown in FIG. 7. In the event that the barrier metal 21 is of a material which is difficult to etch, the shape of the barrier metal 21 is transferred to lower layers by the etching, and remains of the membranes 21, 18, 17, 16, and 15 are formed in portions formed by the side walls, as shown in FIG. 7. Because of this, a problem occurs in that, in the event that a residual membrane of the remains appears at the electrode of one of 21, 18, or 17, a short circuit occurs between adjacent second wiring layers 22 due to the conductor or semiconductor of one of 21, 18, or 17, and a leakage current increases when a large voltage is applied between the second wiring layers 22. Also, as the remains are of a thin dimension, the residual membrane is suspended due to the etching, causing a short circuit in another pattern, or a pattern abnormality.

Also, in the event that pointed portions formed of 21, 18, and 17 appear between opposed second wiring layers 22, as shown in FIG. 7, it becomes difficult to secure a withstand voltage between the wiring because of an electric field concentration. Therefore, it is difficult to further reduce a wiring pitch, forming a high density memory cell, and increase a wiring length, forming a large scale array, while reducing power consumption due to a leakage current. Furthermore, as the pattern of the groove formed in the diode 18 is transferred to the first wiring layer 13, as shown in FIG. 7, the resistance of the first wiring layer 13 increases.

Also, the depositing of the stopper layer 19 configured of an insulator, and the process of stripping the stopper layer 19, being necessary, the process becomes accordingly complex. Also, as the barrier metal 21 is formed between the second wiring layer 22 and diode 18, as shown in FIG. 5, an aspect ratio when processing the second wiring layer 22 increases by the amount of the barrier metal 21. Also, it is necessary to imbed the barrier metal 21 and second wiring layer 22 in the reverse taper groove appearing in the stopper layer 19 stripping process, for which reason a depositing apparatus with good coverage is needed. It being generally common that a depositing apparatus with good coverage uses reaction rate control, a depositing rate decreases, and a throughput decreases.

Hereafter, a description will be given of embodiments of the invention configured based on these kinds of finding.

Figure 9:
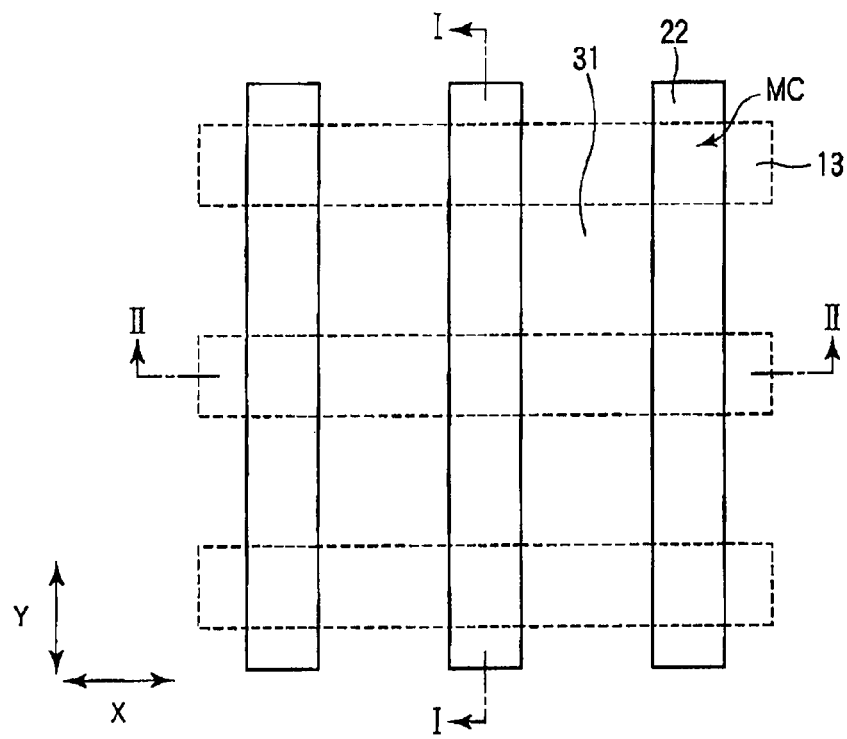
FIG. 9 is a plan view showing a configuration of ad resistance variation type memory according to a first embodiment of the invention.
Figure 10:
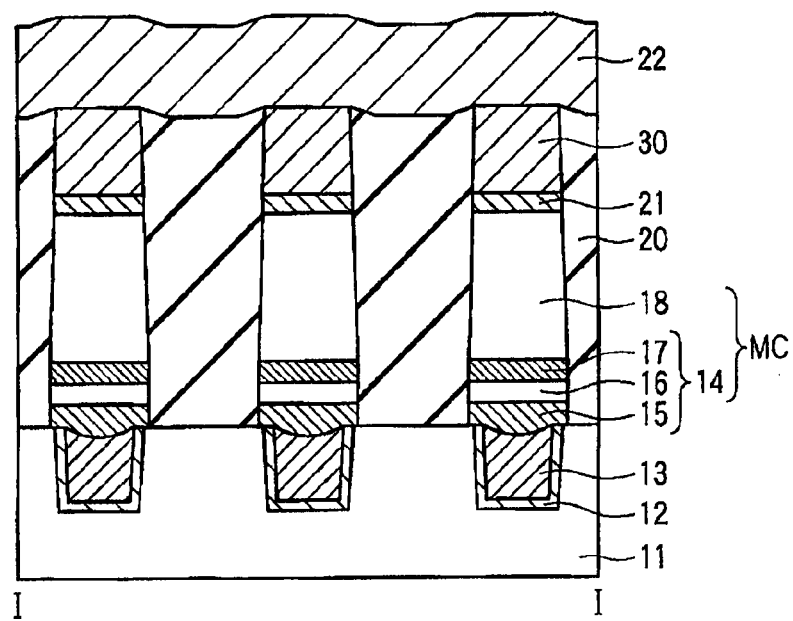
FIG. 10 is a sectional view showing a configuration of a resistance variation type memory along a line I-I shown in FIG. 9.
Figure 11:
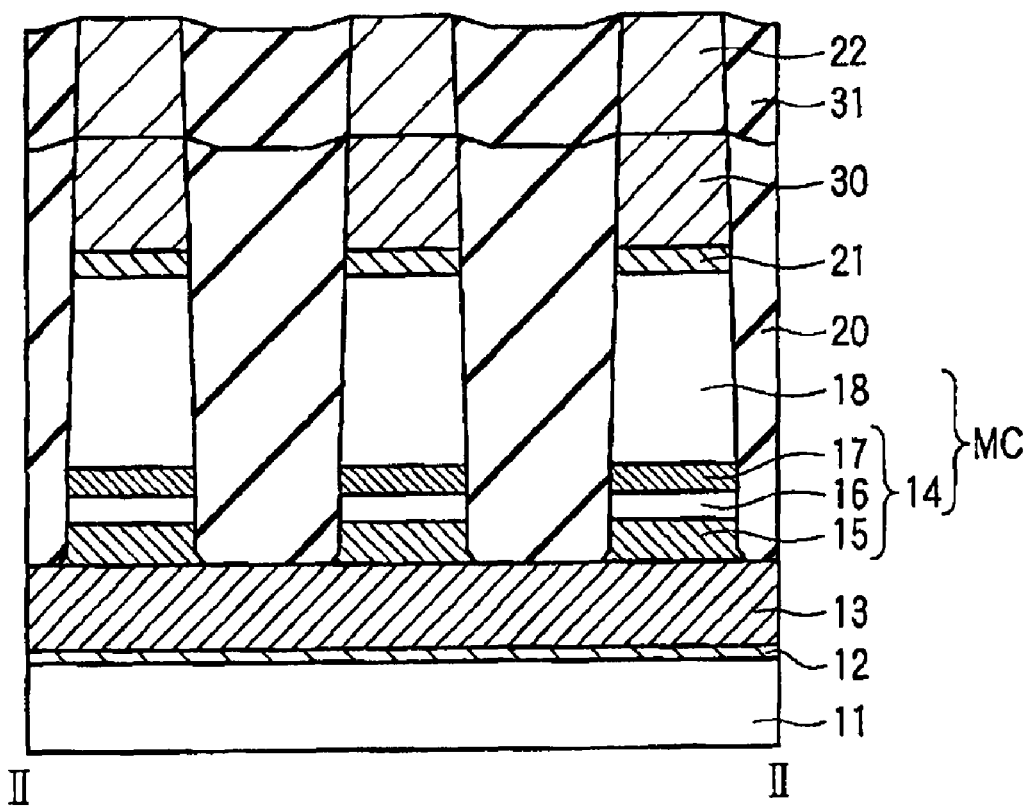
FIG. 11 is a sectional view showing the configuration of the resistance variation type memory along a line II-II shown in FIG. 9.

FIG. 9 is a plan view showing a configuration of a resistance variation type memory according to a first embodiment of the invention. FIG. 10 is a sectional view showing a configuration of a resistance variation type memory along a line I-I shown in FIG. 9. FIG. 11 is a sectional view showing a configuration of a resistance variation type memory along a line II-II shown in FIG. 9.

The interlayer insulator 11 made of, for example, silicon oxide or silicon nitride is provided on an optional level layer formed on, for example, a silicon single-crystal substrate (not shown). A plurality of linear first wiring layers (bit lines) 13, each extending in an X direction, are provided in a plurality of grooves formed in the interlayer insulator 11. Tungsten, tungsten silicon, copper, aluminum, platinum, nickel silicon, cobalt silicon, titanium silicon, molybdenum silicon, or the like, is proposed as a conductive material of the first wiring layer 13. Particularly preferable is tungsten or tungsten silicon, which are materials resistant to a heat process for manufacturing a laminated structure after forming the first wiring layer 13, or for activating a variable resistance element or non-ohmic element, and are materials which have a low resistance. The first wiring layer 13 has a width of 10 to 200 nm, a wiring interval of 10 to 200 nm, and a thickness of 10 to 200 nm.

The side surfaces and bottom surface of the first wiring layer 13 are covered with the barrier metal 12. The barrier metal 12 prevents the first wiring layer 13, made of tungsten or the like, diffusing into the interlayer insulator 11. The barrier metal 12 has a thickness of 2 to 50 nm, and titanium, titanium nitride, tantalum nitride, tantalum aluminum nitride, or the like, is used. In this way, the first wiring layer 13 is configured of a damascene wiring. The damascene wiring (first wiring layer 13) formed using the damascene method has a tapered shape which widens toward the top. A plurality of pillar-shaped non-volatile memory cells MC are provided on the first wiring layer 13. Each memory cell MC includes the variable resistor element 14 and non-ohmic element 18 connected in series.

Specifically, a plurality of pillar-shaped variable resistor elements 14 are provided on the first wiring layer 13. The variable resistor element 14 is configured by the lower electrode 15, recording layer 16, and upper electrode 17 being laminated in order. The recording layer 16, by a voltage or current being applied, can take at least two resistance values as a bistable state at least room temperature. By writing and retrieving the two stable resistance values, at least a binary memory operation is realized.

A transition metal oxide membrane, an oxide of titanium or copper, or the like, being used as a material of the recording layer 16, specifically, nickel oxide, titanium oxide, zinc manganese oxide, tungsten oxide, iron oxide, copper oxide, cobalt oxide, or the like, is proposed. The thickness of the recording layer 16 is 5 to 100 nm.

Also, it is also acceptable that the recording layer 16 is configured of a material which realizes a low resistance condition from a high resistance condition due to a dielectric breakdown. As this kind of material of the recording layer 16, for example, silicon oxide, silicon oxynitride, silicon nitride, or aluminum 203, is proposed. The thickness thereof is 1 to 10 nm. Alternatively, it is also acceptable to use a chalcogenide series GST (GeSb$_x$Te$_y$), N-doped GST, O-doped GST, GeSb, InGe$_x$Te$_y$, or the like, whose resistance condition changes due to Joule heat generated by a voltage applied to both extremes.

The lower electrode 15 and upper electrode 17 each being also able to, in addition to their role as electrodes, simultaneously perform a role as a barrier against the recording layer 16, or as a connecting layer, a metal, a conductive oxide thereof, a conductive carbide thereof, or a conductive nitride thereof, is used. The lower electrode 15 and upper electrode 17 each have a thickness of 2 to 100 nm.

As a conductive material of the lower electrode 15 and upper electrode 17, tungsten, platinum, gold, silver, titanium aluminum nitride, strontium tungsten oxide, ruthenium, ruthenium oxide, ruthenium nitride, iridium, iridium dioxide, cobalt, titanium, titanium nitride, tantalum nitride, lanthanum nitrate, aluminum, platinum iridium oxide, platinum rhodium oxide, rhodium, tantalum aluminum nitride, titanium carbide, tantalum carbide, tungsten carbide, tungsten nitride, or the like, is proposed.

The non-ohmic element 18 is provided on the variable resistance element 14. As the non-ohmic element 18 which applies a voltage with unidirectional polarity of, for example, 0V or more, which does not become negative, between the first wiring layer and second wiring layer, it is possible to use various kinds of diode, such as a: a Schottky diode, which brings into contact an N-type semiconductor (N-type poly-silicon) and a metal, b: a PN junction diode, which joins a P-type semiconductor (P-type poly-silicon) and an N-type semiconductor (N-type poly-silicon), or c: a PIN junction diode, which sandwiches an I (intrinsic) layer between a P-type semiconductor and an N-type semiconductor. The thickness of the non-ohmic element 18 is set in a range of 5 to 300 nm.

It is desirable to make the non-ohmic element 18 a diode which includes a semiconductor of silicon, silicon germanium, germanium, or the like, as an interface state density is low, and it can be formed with good control using a heretofore known semiconductor process. Also, in the event of using the diode connected in series with the variable resistance element 14, as characteristics thereof mean that it is possible to prevent a reverse current using a rectifying property, it is possible to carry out a drive on the wiring with a constant direction of voltage polarity (a so-called unipolar operation), even when forming a wiring array structure in the plane. By this means, as it is possible to use a single polarity voltage element in a peripheral circuit, it is possible to downscale the peripheral circuit.

Figure 12:
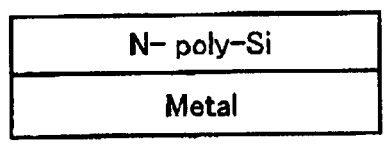
FIGS. 12A to 12E are outline diagrams showing a configuration of a non-ohmic element 18.
Figure 12:
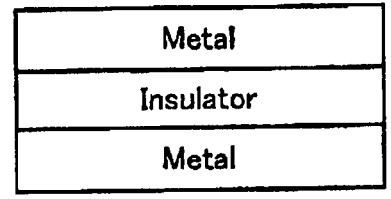
Figure 12:
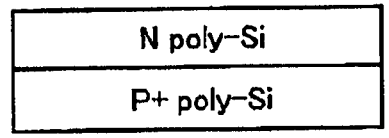
Figure 12:
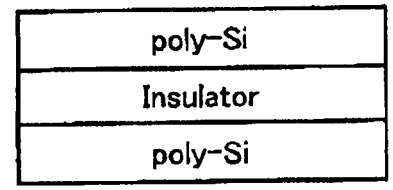
Figure 12:
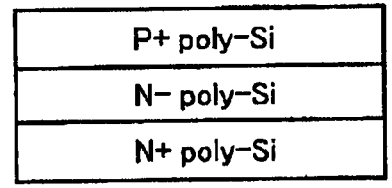

As shown in FIG. 12, in the event of applying a voltage with positive and negative polarity to the first wiring layer and second wiring layer, it is possible to use, as another non-ohmic element 18, for example, d: a metal-insulator-metal (MIM) structure, which sandwiches an insulator with two metals, or e: a semiconductor-insulator-semiconductor (SIS) structure, which sandwiches an insulator with two semiconductors (poly-silicon). In this case, it is possible to carry out a bipolar operation as the variable resistance element 14.

On the non-ohmic element (for example, a diode) 18, there is provided the barrier metal 21, which functions as a barrier between the diode 18 and a stopper layer 30, to be described hereafter, and as a bonding layer. As a material of the barrier metal 21, titanium, titanium nitride, tantalum nitride, or tantalum aluminum nitride is proposed. The thickness of the barrier metal 21 is 2 to 50 nm. In the event that tungsten copper, cobalt, nickel, or the like, which are low resistance metals formed above the diode 18, diffuse into the diode 18 configured of a semiconductor, they form a deep level in the diode 18, and become a carrier trapping level, whereon the rectifying property of the diode deteriorates. For this reason, a configuration is such that the barrier metal 21 is formed between the diode 18 and the low resistance metal, so that the diode 18 and low resistance metal do not come into direct contact.

The stopper layer 30, which is used as a stopper in the interlayer insulator CMP process, is provided on the barrier metal 21. The stopper layer 30 being configured of a conductor, tungsten, platinum, gold, silver, titanium aluminum nitride, strontium tungsten oxide, ruthenium, ruthenium oxide, ruthenium nitride, iridium, iridium dioxide, cobalt, titanium, titanium nitride, tantalum nitride, lanthanum nitrate, aluminum, platinum iridium oxide, platinum rhodium oxide, rhodium, tantalum aluminum nitride, titanium carbide, tantalum carbide, tungsten carbide, tungsten nitride, or the like, is proposed as a conductive material thereof.

A plurality of linear second wiring layers (word lines) 22, each extending in a Y direction, are provided on the stopper layer 30. As the second wiring layer 22, tungsten, tungsten silicon, copper, aluminum, platinum, nickel silicon, cobalt silicon, titanium silicon, molybdenum silicon, or the like, is proposed. The width of the second wiring layer 22 is 10 to 200 nm, the wiring interval is 10 to 200 nm, and the thickness is 10 to 200 nm.

The interlayer insulator 20 is provided between pillar-shaped laminated bodies (the memory cell MC, barrier metal 21, and stopper layer 30). The side surfaces of the barrier metal 21 and stopper layer 30 are each in contact with the interlayer insulator 20, and are configured in a single layer in an in-plane direction. As shown in FIG. 10, the position of the top surface of the stopper layer 30 and the position of the top surface of the interlayer insulator 20 are the same. Strictly speaking, in the event that the top surface of the interlayer insulator 20 is of a dishing form, the "top surface of the interlayer insulator 20" means an extreme of the interlayer insulator 20 which is in contact with the stopper layer 30.

An interlayer insulator 31 is provided on the interlayer insulator 20, and between the second wiring layers 22. As a material of the interlayer insulators 20 and 31, silicon dioxide (SiO$_2$), tetra-ethyl-ortho-silicate (TEOS), high density plasma (HDP) silicon dioxide, hydrogen silsesquioxane (HSQ), methyl silsesquioxane (MSQ), boron phosphorus silicate glass (BPSG), phosphorus silicate glass (PSG), boron silicate glass (BSG), polysilazane, or the like, is proposed. In this way, a resistance variation type memory of the embodiment is configured.

As is clear from FIGS. 9 to 11, unlike the comparison example, the barrier metal 21, rather than being formed in the sheer side walls of the interlayer insulator 20, is formed flatly. Therefore, as it is possible to increase the width of the stopper layer 30 by the amount provided by the barrier metal 21 not being formed on the side surfaces of the stopper layer 30, it is possible to alleviate the problem wherein the serial resistance of the memory cell increases.

Figure 13:
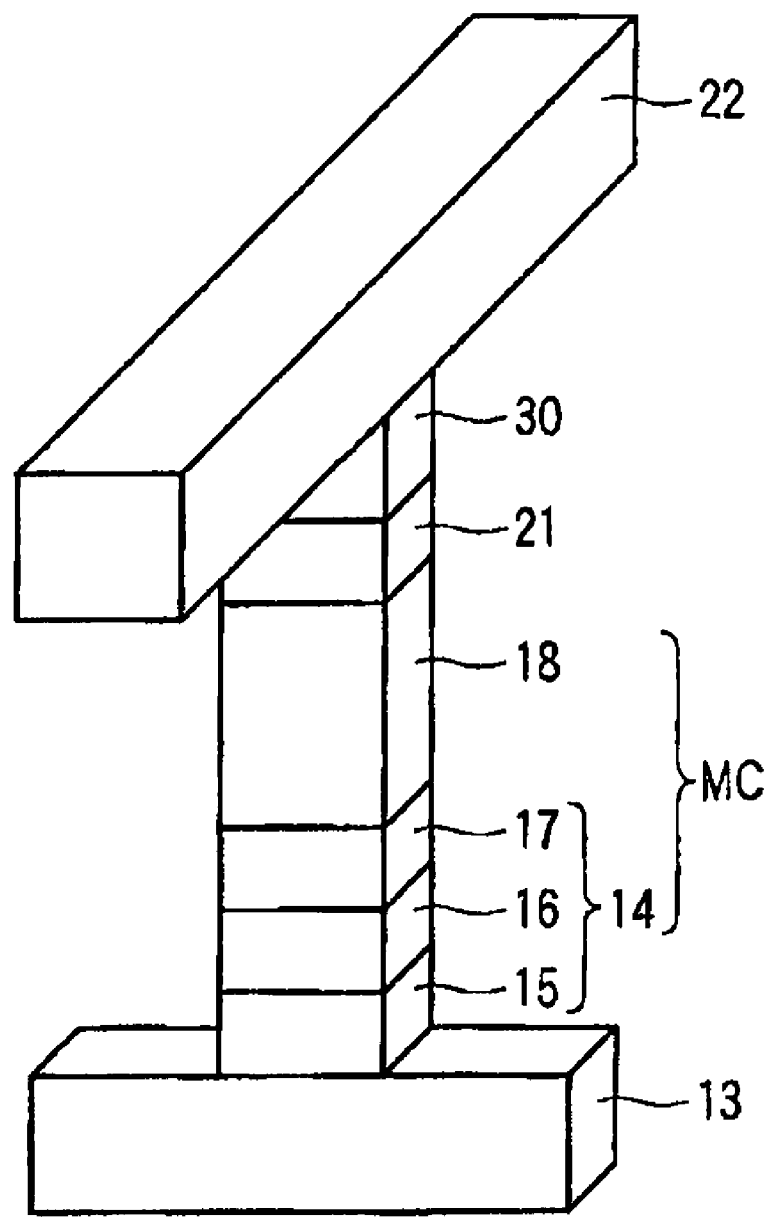
FIG. 13 is a bird's eye view of one memory cell MC extracted.

In order to further increase an understanding of the resistance variation type memory of the embodiment, a bird's eye view corresponding to one memory cell MC is shown in FIG. 13. As shown in FIG. 13, the extension direction of the first wiring layer 13 and the extension direction of the second wiring layer 22 being in an orthogonal, or skewed, positional relationship, the variable resistance element 14 and diode 18 are formed, in a portion where the wiring layers are in proximity, so as to be electrically connected in series, configuring one memory cell MC.

Figure 14:
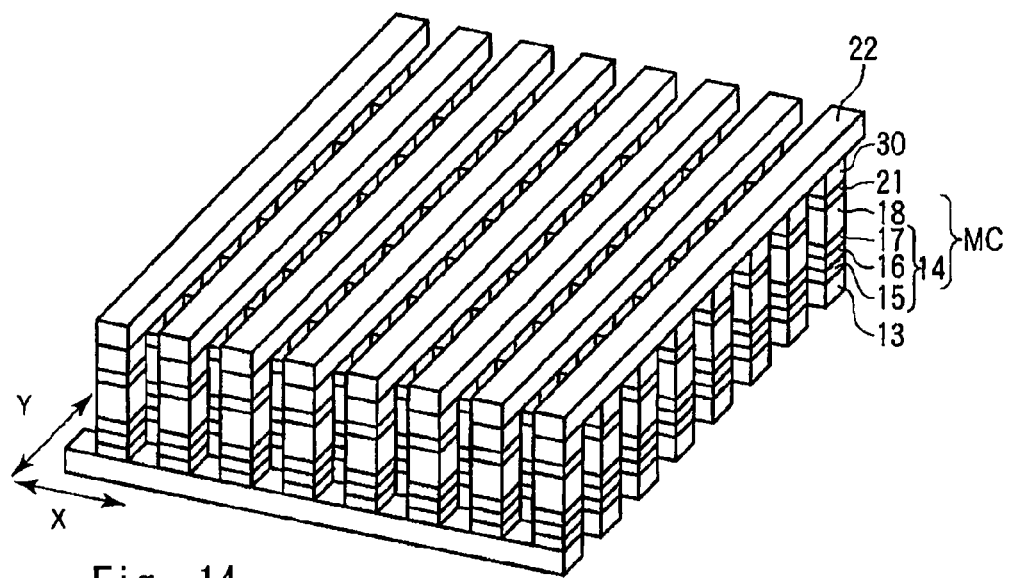
FIG. 14 is a perspective view showing the configuration of the resistance variation type memory according to the first embodiment.

A resistance variation type memory having a crosspoint type array structure, with the memory cell MC as a unit, is shown in FIG. 14. In FIG. 14, a depiction of the interlayer insulators 20 and 31 is omitted. In the crosspoint type array structure, the memory cell MC is periodically formed in all the portions where the plurality of first wiring layers 13 and the plurality of second wiring layers 22 are in proximity, and a dense memory cell array is formed. Also, the second wiring layers 22 connect in parallel terminals which are electrically connected to the diode 18, while the first wiring layers 13 connect in parallel terminals which are electrically connected to the variable resistance element 14.

As it is commonly known through a circuit and technique described in, for example, Japanese Patent No. 3,839,958 that it is possible to retrieve data of a memory cell whose resistance varies, using an array structure formed by these kinds of first wiring layer and second wiring layer, a description will be omitted here.

Figure 15:
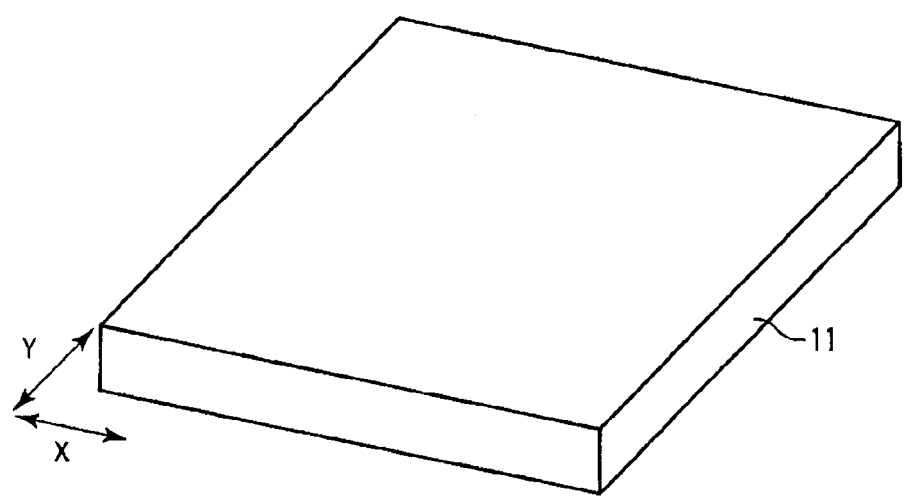
FIG. 15 is a perspective view showing a manufacturing process of the resistance variation type memory according to the first embodiment.

Next, a description will be given of one example of a manufacturing method of the resistance variation type memory according to the embodiment. Firstly, as shown in FIG. 15, a front end of line (FEOL) process is carried out, creating an MOS transistor or bipolar transistor on, for example, a silicon single crystal substrate (not shown), and the interlayer insulator 11 made of, for example, silicon oxide or silicon nitride, is deposited to a thickness of 10 to 1000 nm on the FEOL structure.

Figure 16:
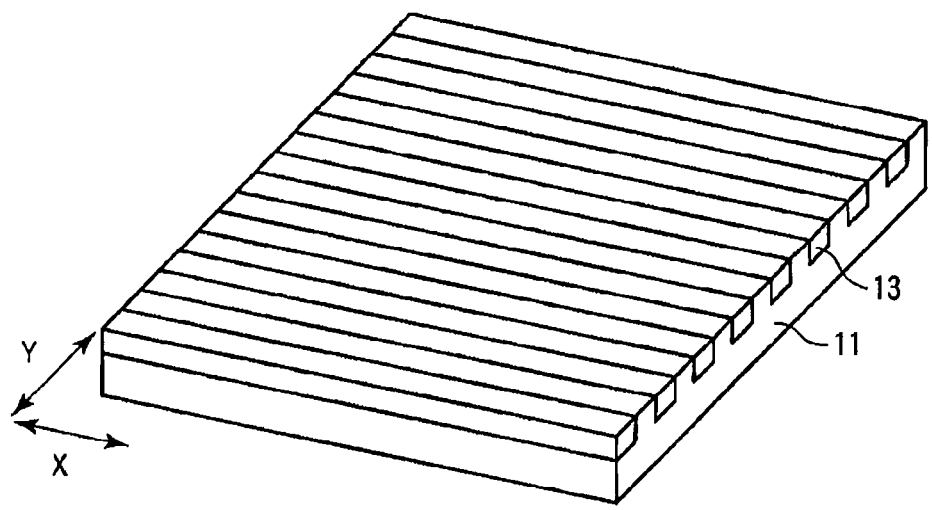
FIG. 16 is a perspective view showing a manufacturing process of the resistance variation type memory according to the first embodiment.

Next, as shown in FIG. 16, a plurality of first wiring layers 13 are formed, using the damascene method, in the interlayer insulator 11. That is, a plurality of grooves in which the first wiring layers 13 are to be formed are formed in the interlayer insulator 11. Next, the barrier metals 12 (not shown), and the first wiring layers 13, are deposited in order in the grooves, and the barrier metals 12 and first wiring layers 13 are polished and planarized using the CMP method, in such a way as to leave only the portions in the grooves. By this means, the plurality of linear first wiring layers 13, each extending in the X direction, are formed inside the interlayer insulator 11. For example, tungsten is used as the first wiring layers 13.

Figure 17:
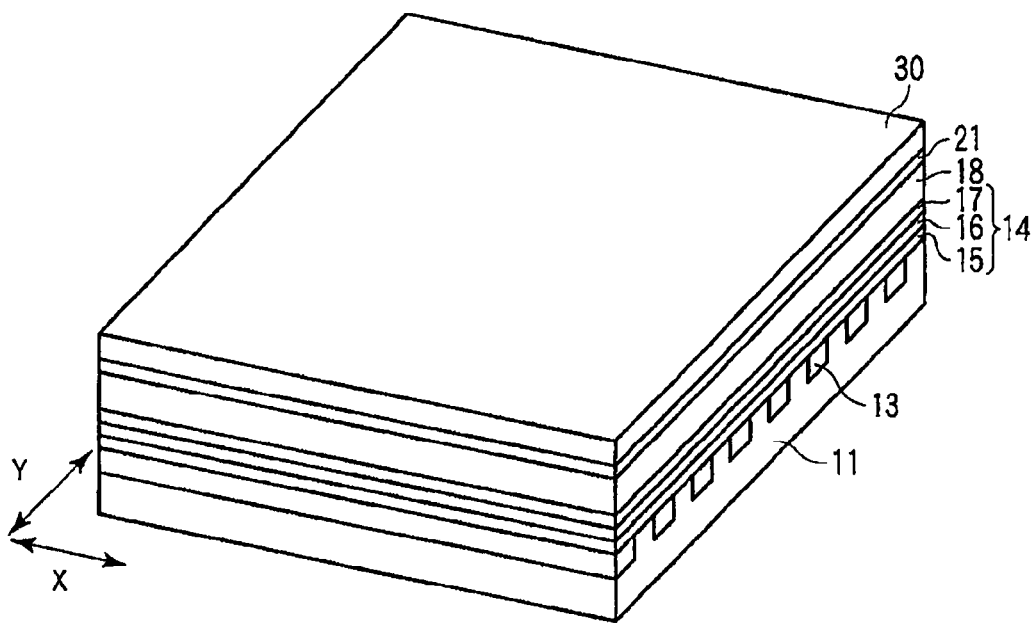
FIG. 17 is a perspective view showing a manufacturing process of the resistance variation type memory according to the first embodiment.

Next, as shown in FIG. 17, the lower electrode 15, recording layer 16, and upper electrode 17, which configure the variable resistance element 14, are deposited in order on the first wiring layers 13. Furthermore, after depositing the diode 18 configured of, for example, a silicon semiconductor, on the variable resistance element 14, the barrier metal 21 is deposited on the diode 18. Next, the stopper layer 30 configured of a conductor, which functions as a stopper in the interlayer insulator 20 CMP process, is deposited.

Figure 18:
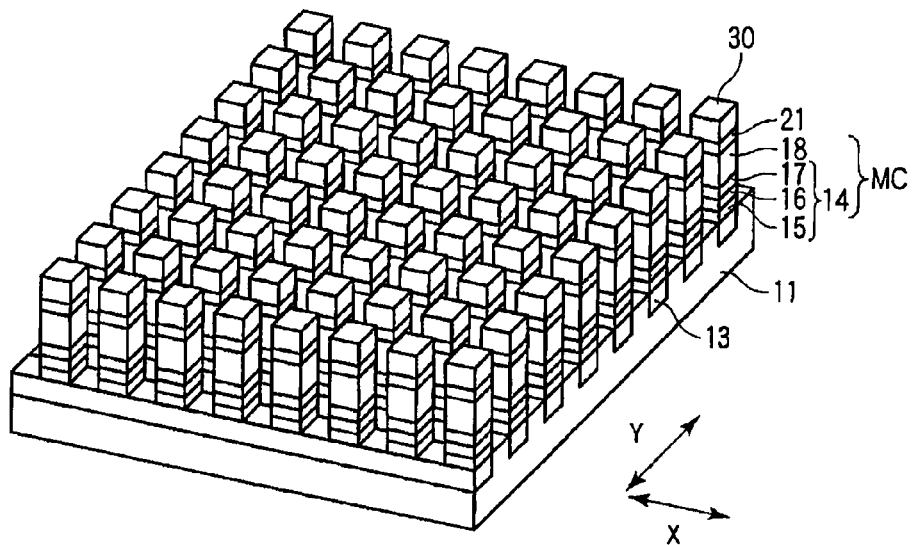
FIG. 18 is a perspective view showing a manufacturing process of the resistance variation type memory according to the first embodiment.

Next, as shown in FIG. 18, the laminated membranes are processed using the lithography and anisotropic RIE method, forming a plurality of pillar-shaped memory cells MC. This etching is carried out until the top surface of the first wiring layer 13 is exposed.

Figure 19:
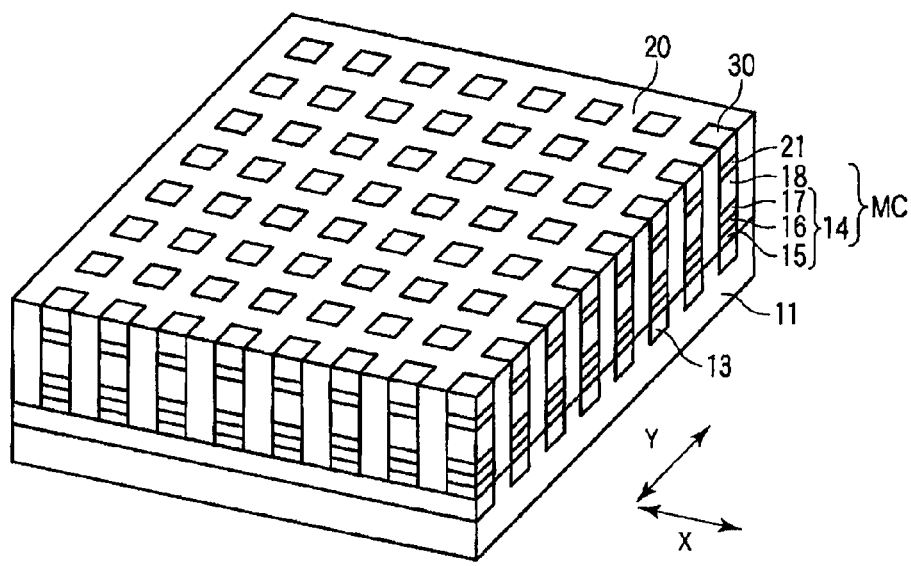
FIG. 19 is a perspective view showing a manufacturing process of the resistance variation type memory according to the first embodiment.

Next, as shown in FIG. 19, the interlayer insulator 20 made of, for example, silicon oxide or silicon nitride is embedded on the first wiring layers 13, and between the memory cells MC, until it reaches the top surface of the stopper layer 30. Then, using the stopper layer 30 as a stopper, the top surface of the interlayer insulator 20 is planarized using a CMP method. By this means, as shown in FIG. 10, the interlayer insulator 20 is in contact with the side surfaces of the stopper layer 30, and its top surface is flat. Actually, due to constraints of the process, the height of the central portion of the interlayer insulator 20 is slightly less than that of the stopper layer 30, and the so-called dishing form results, as shown in FIG. 10. In other words, the top surface of the interlayer insulator 20 is depressed. Consequently, in the embodiment, the dishing form is also included in the "flatness". The dishing form changes depending on the method used in the planarizing process, and on the width of the insulator which is the subject of the planarizing. For example, when the width of the insulator is made around 50 nm, the central portion thereof sags around 2 to 15 nm in comparison with the edges.

Figure 20:
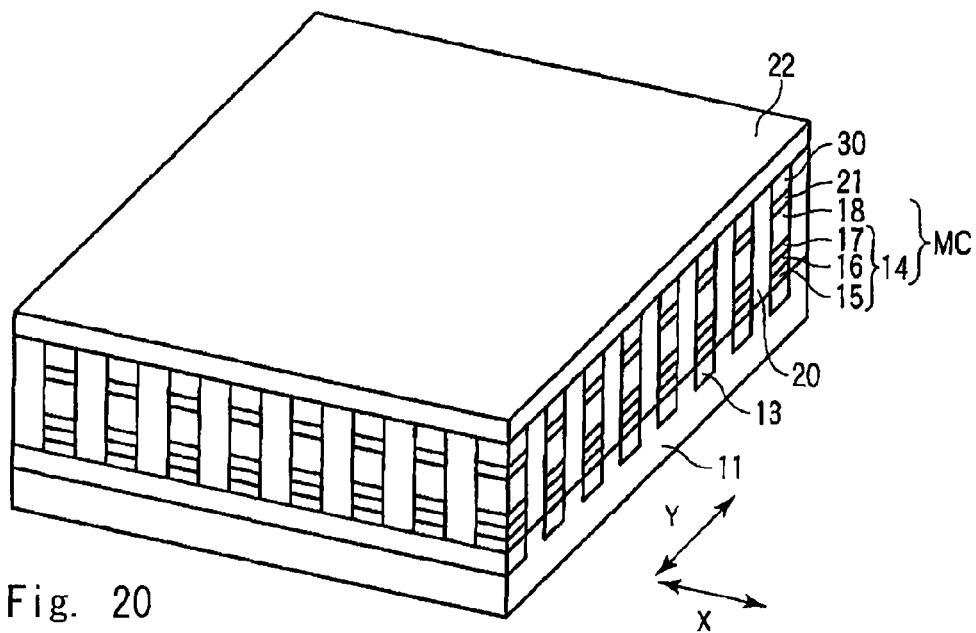
FIG. 20 is a perspective view showing a manufacturing process of the resistance variation type memory according to the first embodiment.
Figure 21:
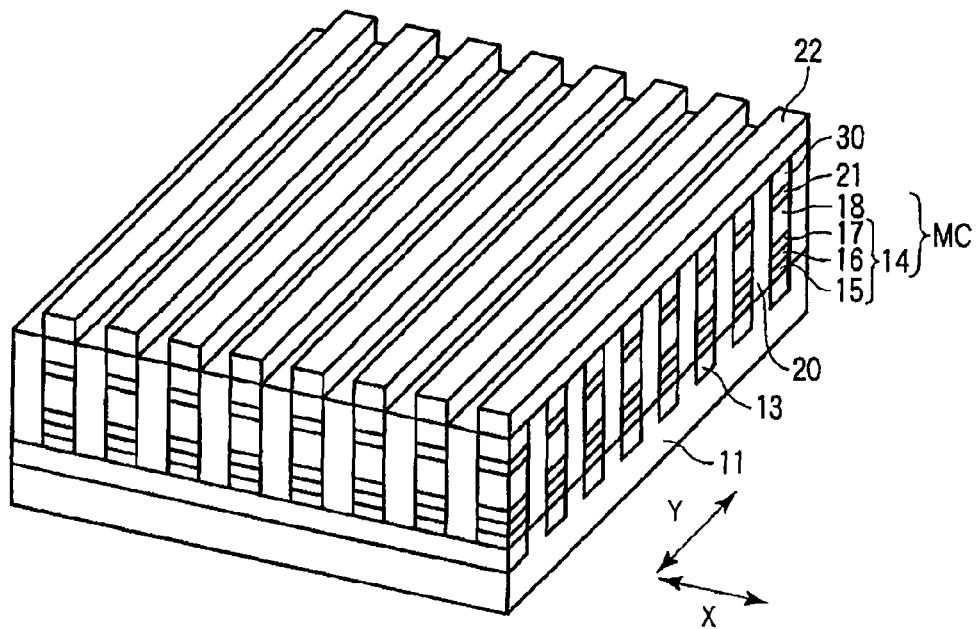
FIG. 21 is a perspective view showing a manufacturing process of the resistance variation type memory according to the first embodiment.

Next, as shown in FIG. 20, the second wiring layer 22 is deposited on the interlayer insulator 20. At this time, as the top surface of the interlayer insulator 20 has already been planarized by the process of FIG. 19, it is possible to deposit the conductive material acting as the second wiring layer 22, even in the event of using a conductive material with poor coverage. In the comparison example, as the barrier metal 21 is formed between the second wiring layer 22 and interlayer insulator 20, and it is necessary to embed the barrier metal 21 and second wiring layer 22 in the reverse taper groove caused by the stripping of the insulator stopper layer 19, as shown in FIG. 5, a depositing apparatus with good coverage is needed.

In comparison with this, in the embodiment, as it is possible to use a conductive material with poor coverage, and a physical vapor deposition (PVD) method or sputtering method, in the second wiring layer 22 depositing process, the process is demonstrably easier.

Also, it is possible to deposit the second wiring layer 22 with good throughput using a membrane formation method whose deposition rate is higher than its reaction rate control, for example, the PVD method or sputtering method. Therefore, it is possible to deposit reducing impurities, for example, carbon, nitrogen, or water, incorporated into the membrane due to a raw material decomposing with a chemical vapor deposition (CVD) method, and with regard to a membrane formation temperature too, it is possible to carry out a low temperature formation of the second wiring layer 22 at a temperature not limited to a decomposition temperature of the raw material, for example, a temperature lower than 600° C. Therefore, in the event that the recording layer 16 deteriorates due to a high temperature heat process, it is possible to prevent the deterioration of the recording layer 16 by forming the conductive material configuring the second wiring layer 22 using the PVD method or sputtering method.

Furthermore, with a depositing of a metal using the CVD method, as a membrane formation rate varies depending on an amount of electrons supplied to the surface before depositing, the thicknesses of the membranes formed on the insulator and metal differ. For this reason, in the event of forming the second wiring layer 22 using the CVD method, in order to improve the coverage, it is also necessary to form the barrier metal 21, necessary for an even membrane formation, on the top surface and side surfaces of the interlayer insulator 20, as shown in FIG. 5. For this reason, in the comparison example, a problem occurs in that the aspect ratio when processing the second wiring layer 22 increases by the amount of the barrier metal 21, but in the embodiment, it is possible to prevent this problem. Referring to, for example, FIG. 10, the aspect ratio means the ratio of the height of the top surface of the stopper layer 30 from the bottom surface of the memory cell MC with respect to the width of the pillar-shaped memory cell MC (the width of the variable resistance element 14 or diode 18).

Next, the second wiring layer 22 is processed using the lithography and RIE method. By carrying out this etching until the top surface of the interlayer insulator 20 is exposed, a plurality of second wiring layers 22 are electrically separated. By this means, the plurality of linear second wiring layers 22, electrically connected to the stopper layer 30 and each extending in the Y direction, are formed. The second wiring layer 22 formed using the RIE method has a tapered shape which narrows toward the top. As the second wiring layer 22, for example, tungsten is used.

Subsequently, the interlayer insulator 31 (not shown) made of, for example, silicon oxide or silicon nitride is deposited to a thickness of 10 to 1000 nm on the interlayer insulator 20, so as to fill the spaces between the plurality of second wiring layers 22. By so doing, the resistance variation type memory which has the crosspoint type array structure shown in FIGS. 9 to 11 is formed.

The resistance variation type memory of the embodiment formed in this way has the following kinds of advantage. With the embodiment, it does not happen that remains of the membranes 18, 17, 16, and 15 are formed due to the remains of the barrier metal 21 side walls, which is a problem in the comparison example. Because of this, it is possible to prevent the problem wherein a leakage current, occurring due to a large voltage being applied between the second wiring layers 22, increases because of a short circuit arising from the remains of the barrier metal 21, diode 18, or upper electrode 17.

Also, in the comparison example, as the remains are of a thin dimension, the residual membrane is suspended due to the etching, causing a short circuit in another pattern, or a pattern abnormality. Therefore, in the event that pointed portions formed of the barrier metal 21, diode 18, and upper electrode 17 are formed between opposed second wiring layers 22, as shown in FIG. 7, it becomes difficult to secure a withstand voltage between the wiring layers because of an electric field concentration, but with the embodiment, this problem does not occur either. Therefore, it is possible to further reduce the wiring pitch, forming a high density memory cell array, and increase the wiring length, forming a large scale array, while reducing the power consumption due to the leakage current.

Also, in the comparison example, in the event that a void is formed in the second wiring layer 22, as the amount of the conductor is small in the void portion, the etching proceeds in a corresponding portion under the void, as shown in FIG. 6. Because of this, there is a problem in that, as the groove in the diode 18 is transferred to the first wiring layer 13, as shown in FIG. 7, the resistance of the first wiring layer 13 increases. However, with the embodiment, it is possible to realize a good first wiring layer 13 with no resistance increase or fluctuation.

Also, in the comparison example, the depositing of the insulator configuring the CMP stopper layer 19, and the process of stripping the stopper layer 19, being necessary, the process becomes accordingly complex. With the embodiment, there is an advantage in that, as the conductive CMP stopper layer 30 is used, the insulator stripping process is unnecessary, and it is possible to shorten the process.

First Modification Example

Figure 22:
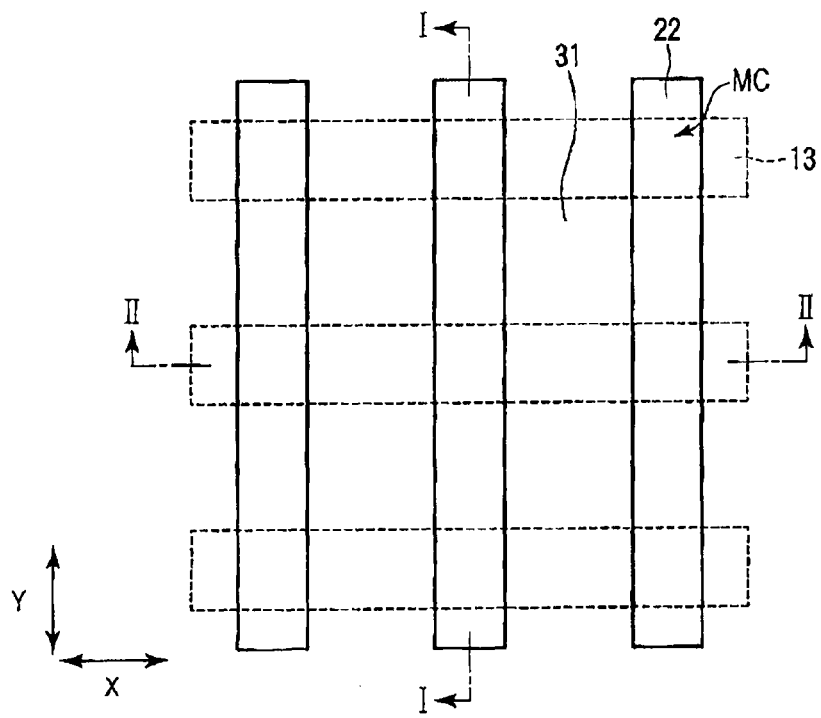
FIG. 22 is a plan view showing a configuration of a resistance variation type memory according to a modification example.
Figure 23:
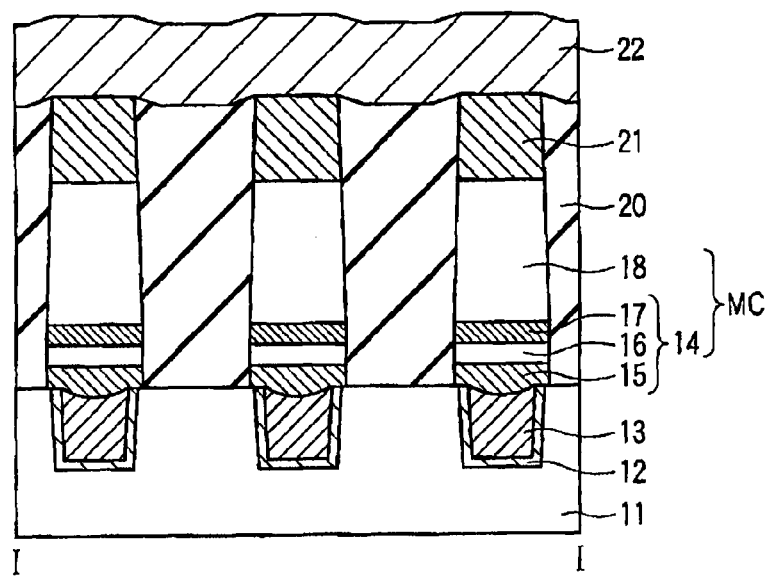
FIG. 23 is a sectional view showing a configuration of a resistance variation type memory along a line I-I shown in FIG. 22.
Figure 24:
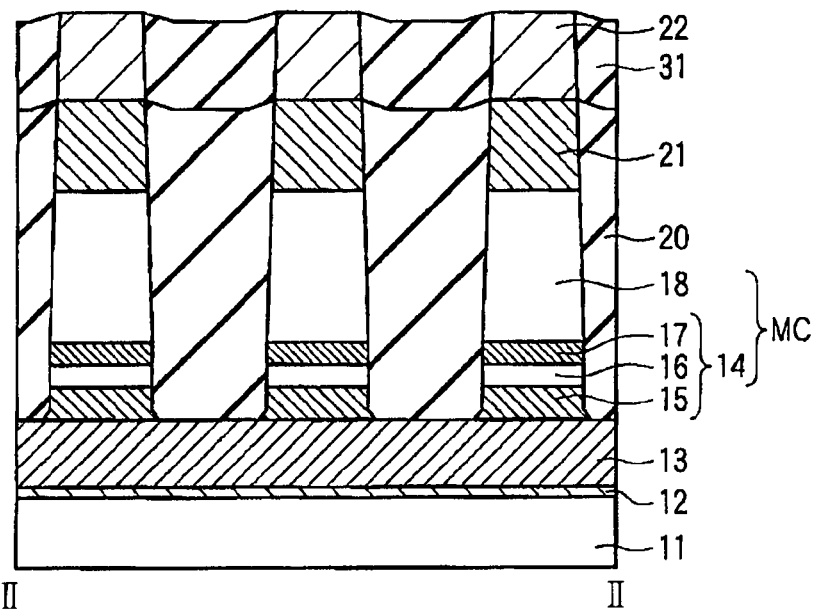
FIG. 24 is a sectional view showing the configuration of the resistance variation type memory along a line II-II shown in FIG. 22.

A first modification example according to the first embodiment will now be described with reference to the drawings. FIG. 22 is a plan view showing a configuration of a resistance variation type memory according to a first modification example. FIG. 23 is a sectional view showing a configuration of a resistance variation type memory along a line I-I shown in FIG. 22. FIG. 24 is a sectional view showing a configuration of a resistance variation type memory along a line II-II shown in FIG. 22.

In a first modification example, the CMP stopper layer 30 shown in FIG. 10 is omitted. Then, as shown in FIG. 23, by depositing the barrier metal 21 more thickly than a thickness which fulfils the function as a barrier, the barrier metal 21 is given a role as an interlayer insulator 20 CMP stopper. The barrier metal 21 being configured of a single layer in the in-plane direction, side surfaces thereof are in contact with the interlayer insulator 20. Also, using a CPM process which uses the barrier metal 21 as a stopper, the top surface of the interlayer insulator 20 takes on a flat or dishing form. The position of the top surface of the barrier metal 21 is the same as the position of the top surface of the interlayer insulator 20.

The hardness of the barrier metal 21 used as the CMP stopper is set high. By making the hardness of the barrier metal 21 high, it is possible to stop the interlayer insulator 20 CMP process at the top surface of the barrier metal 21. As a material of this kind of barrier metal 21, titanium nitride, titanium aluminum nitride, tantalum nitride, tungsten nitride, or the like, is proposed.

Apart from omitting the CMP stopper layer 30, and depositing the barrier metal 21 thickly, the manufacturing method of the first modification example is the same as that of the first embodiment. Consequently, with the first modification example, it is possible to omit the process of depositing the material configuring the CMP stopper layer 30, and the etching process. Also, as it is possible to make the thickness of the barrier metal 21 of FIG. 23 less than the combined thickness of the barrier metal 21 and stopper layer 30 of FIG. 10, it is possible to further reduce the aspect ratio.

Second Modification Example

Figure 25:
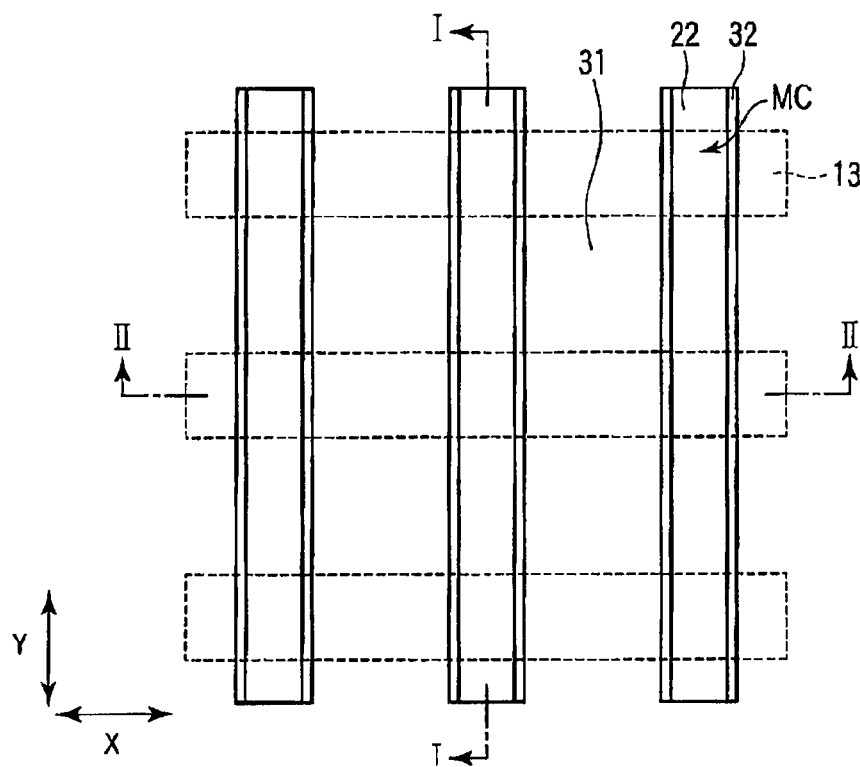
FIG. 25 is a plan view showing a configuration of another resistance variation type memory according to a modification example.
Figure 26:
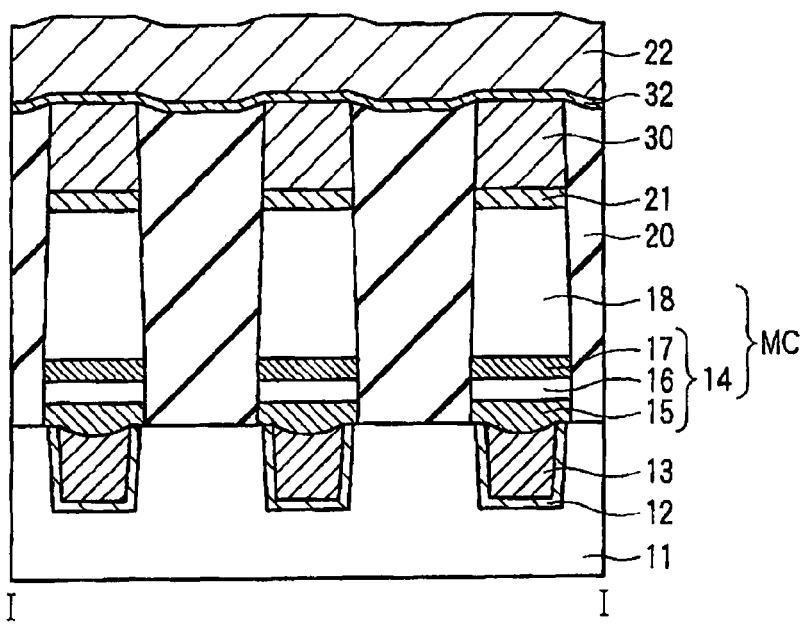
FIG. 26 is a sectional view showing a configuration of a resistance variation type memory along a line I-I shown in FIG. 25.
Figure 27:
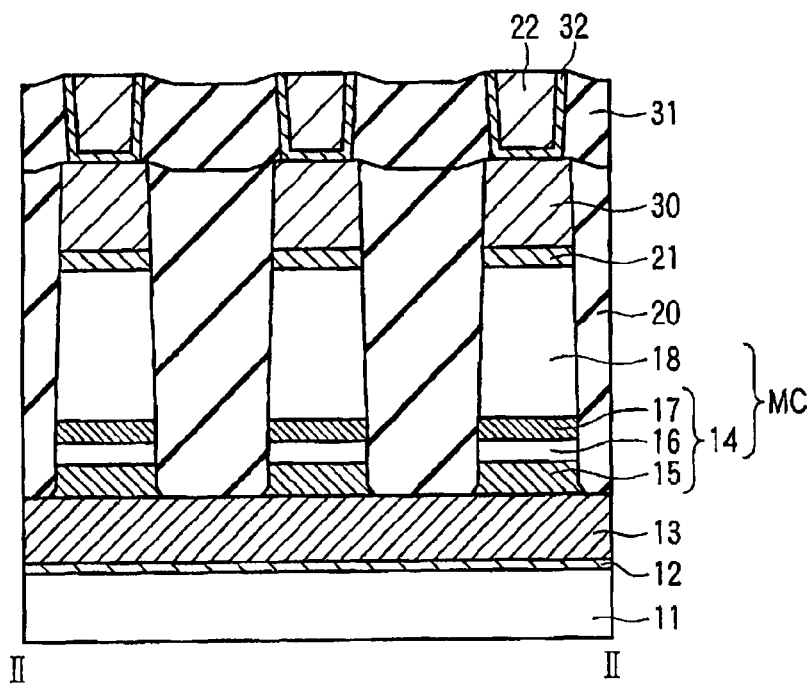
FIG. 27 is a sectional view showing the configuration of the resistance variation type memory along a line II-II shown in FIG. 25.

A second modification example according to the first embodiment will now be described with reference to the drawings. FIG. 25 is a plan view showing a configuration of another resistance variation type memory according to a second modification example. FIG. 26 is a sectional view showing a configuration of a resistance variation type memory along a line I-I shown in FIG. 25. FIG. 27 is a sectional view showing a configuration of a resistance variation type memory along a line II-II shown in FIG. 25.

In a second modification example, the second wiring layer 22 is configured of a damascene wiring, in the same way as the first wiring layer 13. A barrier metal 32, and the second wiring layer 22, are provided on the stopper layer 30. The barrier metal 32 covers the bottom surface and side surfaces of the second wiring layer 22. The second wiring layer 22 configured of the damascene wiring has a tapered shape which widens toward the top. As a material of the barrier metal 32, titanium, titanium nitride, tantalum nitride, tantalum aluminum nitride, or the like, is proposed. The interlayer insulator 31 is embedded on the interlayer insulator 20, and between the barrier metals 32.

The method of forming the second wiring layers 22 is the same as the method of forming the first wiring layers 13. Specifically, the interlayer insulator 31 is deposited on the interlayer insulator 20 and stopper layer 30. Next, a plurality of grooves in which the second wiring layers 22 are to be formed are formed in the interlayer insulator 31. Next, barrier metals 32, and the second wiring layers 22, are deposited in order in the grooves, and the barrier metals 32 and second wiring layers 22 are polished and planarized using the CMP method, in such a way as to leave only the portions in the grooves. By this means, the plurality of linear second wiring layers 22, each extending in the Y direction, are formed in the interlayer insulator 31. The advantages of the second modification example are also the same as those of the first embodiment. Also, it is also possible to apply the first modification example to the second modification example.

Second Embodiment

A second embodiment reduces the number of wiring formation lithography and etching processes by carrying out a patterning in one direction of the first wiring layer 13 at the same time as processing the side walls of the variable resistance element 14 and non-ohmic element 18.

Figure 28:
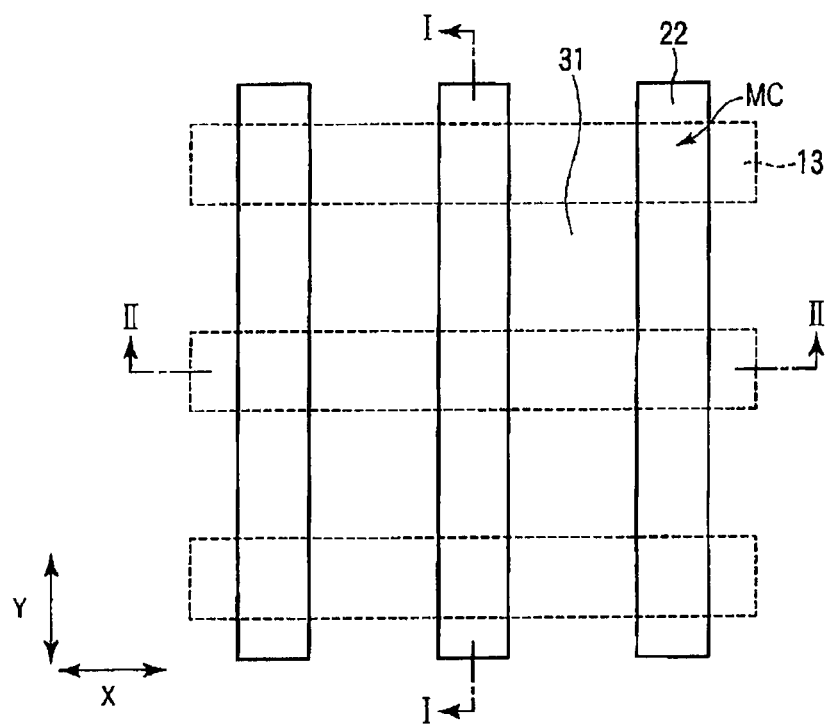
FIG. 28 is a perspective view showing the configuration of the resistance variation type memory according to the second embodiment.
Figure 29:
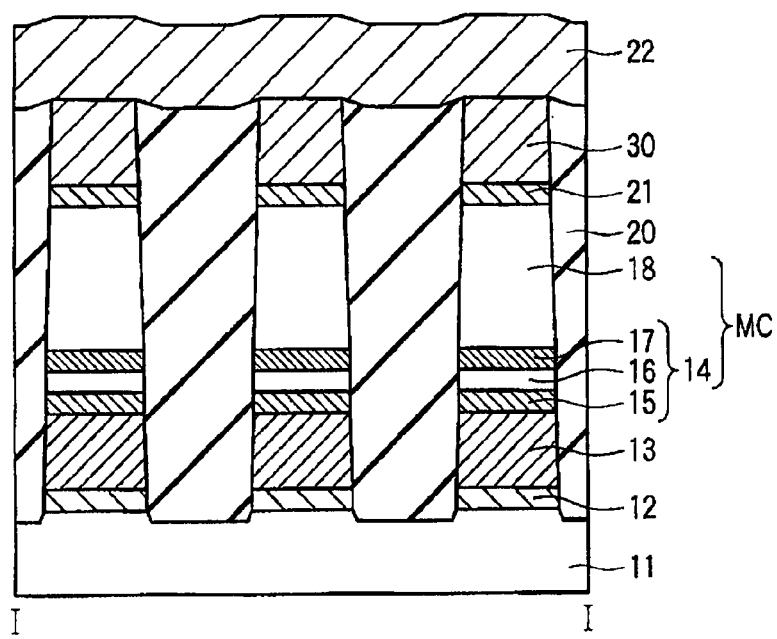
FIG. 29 is a sectional view showing a configuration of a resistance variation type memory along a line I-I shown in FIG. 28.
Figure 30:
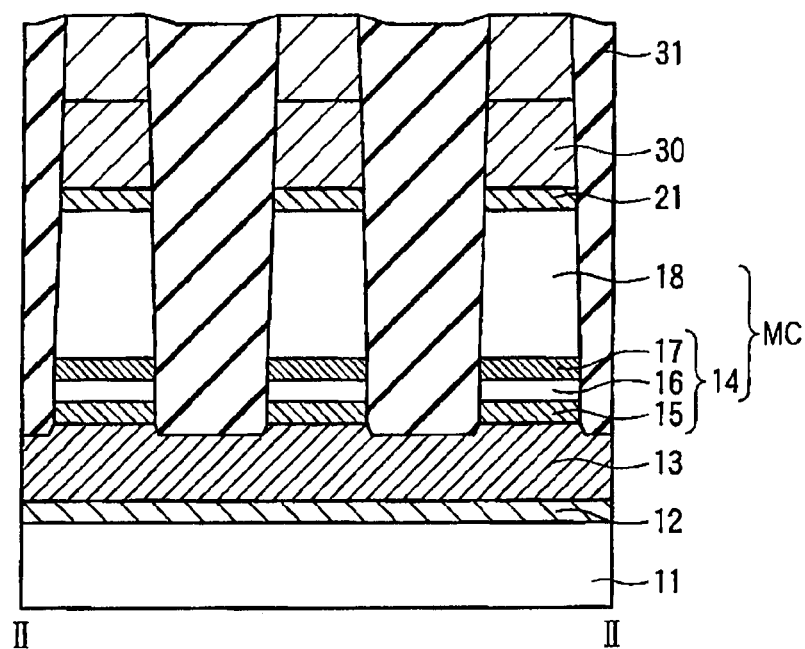
FIG. 30 is a sectional view showing the configuration of the resistance variation type memory along a line II-II shown in FIG. 28.

FIG. 28 is a plan view showing a configuration of a resistance variation type memory according to a second embodiment. FIG. 29 is a sectional view showing a configuration of a resistance variation type memory along a line I-I shown in FIG. 28. FIG. 30 is a sectional view showing a configuration of a resistance variation type memory along a line II-II shown in FIG. 28.

The barrier metal 12 is provided on the interlayer insulator 11. The first wiring layer 13 is provided on the barrier metal 12. The first wiring layer 13 is formed in a linear form in such a way as to extend in the X direction. Unlike the first embodiment, the barrier metal 12 and first wiring layer 13, rather than being embedded in the interlayer insulator 11, are provided on the interlayer insulator 11. Also, unlike the first embodiment, the barrier metal 12 is provided on only the bottom surface of the first wiring layer 13.

The pillar-shaped memory cell MC (including the variable resistance element 14 and non-ohmic element 18) is provided on the first wiring layer 13. On the non-ohmic element (for example, a diode) 18, there is provided the barrier metal 21, which functions as a barrier between the diode 18 and the stopper layer 30, and as a bonding layer. The stopper layer 30, configured of a conductor, which is used as a stopper in the interlayer insulator CMP process, is provided on the barrier metal 21. A plurality of linear second wiring layers 22, each extending in the Y direction, are provided on the stopper layer 30.

The interlayer insulator 20 and interlayer insulator 31 are provided between the pillar-shaped laminated bodies (the memory cell MC, barrier metal 21, and stopper layer 30). That is, the interlayer insulator 20 is provided between adjacent laminated bodies in the Y direction. The interlayer insulator 31 is provided between adjacent laminated bodies in the X direction. The side surfaces of the barrier metal 21 and stopper layer 30 are each in contact with the interlayer insulator 20 and interlayer insulator 31, and are configured in a single layer in the in-plane direction. As shown in FIG. 29, the position of the top surface of the stopper layer 30 and the position of the top surface of the interlayer insulator 20 are the same. Also, the interlayer insulator 20 is provided between the first wiring layers 13. The interlayer insulator 31 is provided between the second wiring layers 22.

The materials of each layer configuring the resistance variation type memory of the second embodiment are the same as those of the first embodiment. In this way, the resistance variation type memory of this embodiment is configured.

Figure 31:
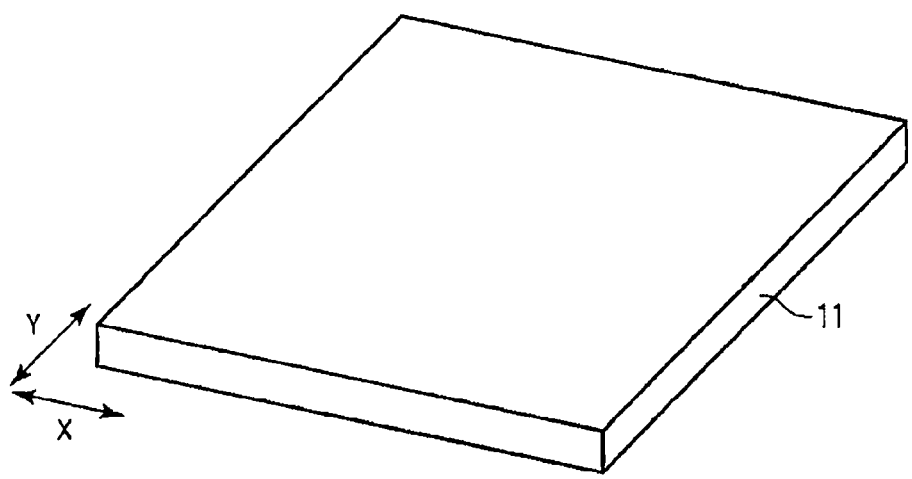
FIG. 31 is a perspective view showing a manufacturing process of the resistance variation type memory according to the second embodiment.

Next, a description will be given of one example of a manufacturing method of the resistance variation type memory according to the embodiment. Firstly, as shown in FIG. 31, an FEOL process is carried out, creating an MOS transistor or bipolar transistor on, for example, a silicon single crystal substrate (not shown), and the interlayer insulator 11 made of, for example, silicon oxide or silicon nitride, is deposited to a thickness of 10 to 1000 nm on the FEOL structure.

Figure 32:
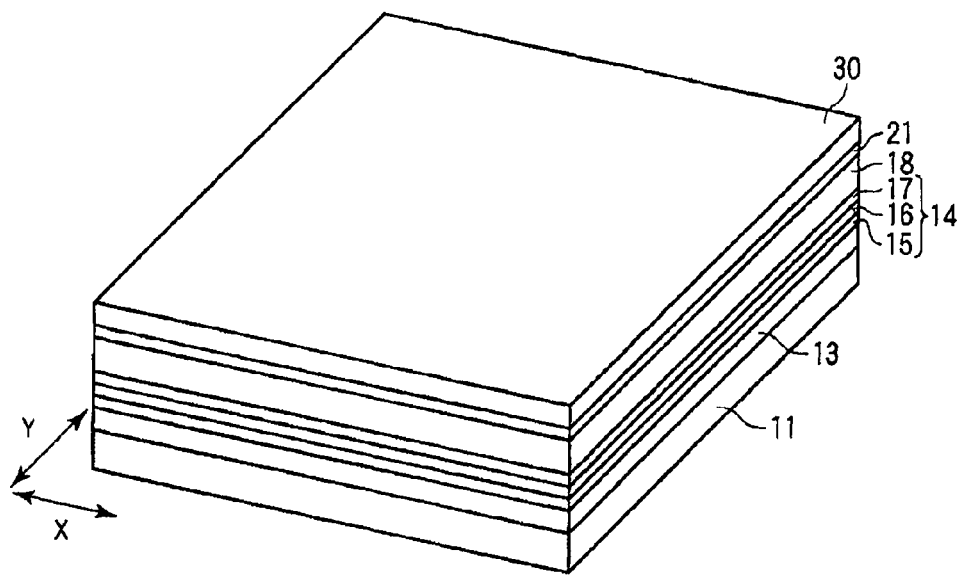
FIG. 32 is a perspective view showing a manufacturing process of the resistance variation type memory according to the second embodiment.

Next, as shown in FIG. 32, the barrier metal 12 (not shown), first wiring layer 13, variable resistance element 14 (the lower electrode 15, recording layer 16, and upper electrode 17), diode 18, barrier metal 21, and stopper layer 30 are deposited in order on the interlayer insulator 11. As the membranes can be deposited on a flat surface, the depositing is possible even in the event of a material with poor coverage. In particular, unlike the first embodiment, the first wiring layer 13 can be deposited on an even surface. Therefore, it is possible to deposit the barrier metal 12 and first wiring layer 13 with good throughput using a membrane formation method, for example, the PVD method or sputtering method, whose deposition rate is higher than its reaction rate control. By this means, it is possible to deposit reducing impurities, for example, carbon, nitrogen, or water, incorporated into the membrane due to a raw material decomposing with the CVD method, and with regard to the membrane formation temperature too, it is possible to carry out a low temperature formation at a temperature not limited to the decomposition temperature of the raw material, for example, a temperature lower than 600° C. By forming the first wiring layer 13 using the PVD method or sputtering method, it is possible to prevent deterioration thereof.

Figure 33:
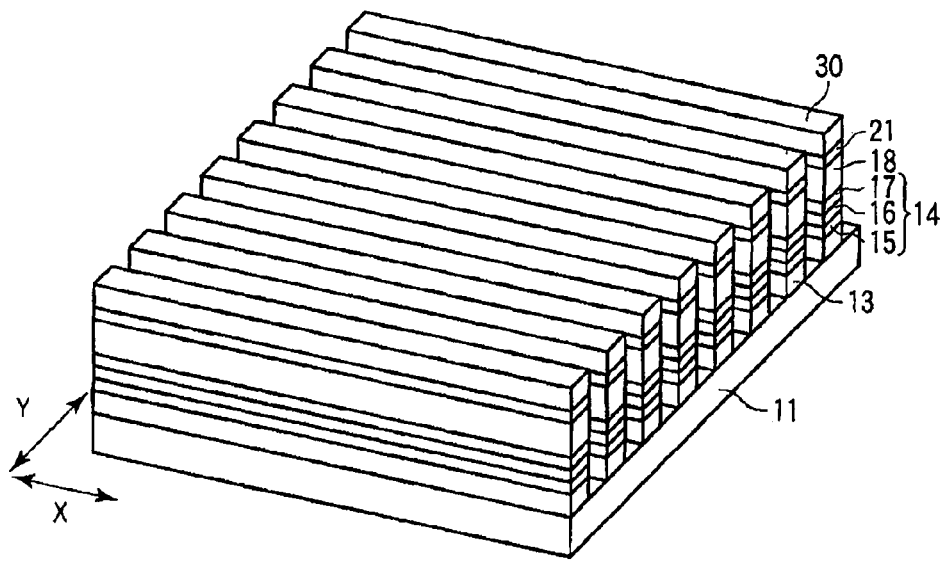
FIG. 33 is a perspective view showing a manufacturing process of the resistance variation type memory according to the second embodiment.

Next, as shown in FIG. 33, the laminated membranes are processed using the lithography and anisotropic RIE method, and divided into a plurality of laminated bodies, each extending in the X direction. This etching is carried out until the top surface of the interlayer insulator 11 is exposed, to a depth at which the barrier metal 12 and first wiring layer 13 can be divided.

Figure 34:
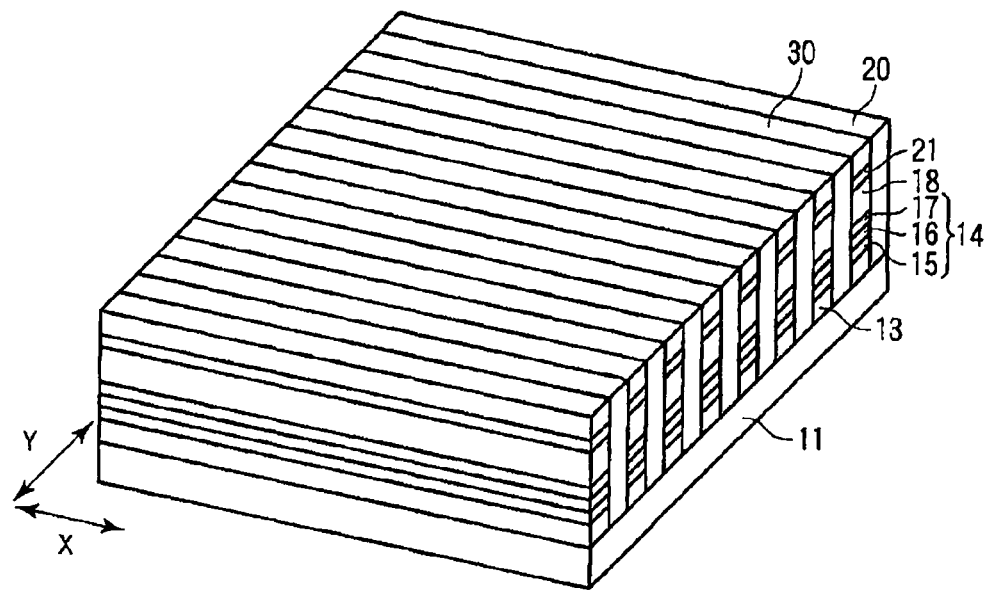
FIG. 34 is a perspective view showing a manufacturing process of the resistance variation type memory according to the second embodiment.

Next, as shown in FIG. 34, the interlayer insulator 20 is embedded between the linear laminated bodies. Then, using the stopper layer 30 as a stopper, the top surface of the interlayer insulator 20 is planarized using the CMP method. By this means, as shown in FIG. 29, the interlayer insulator 20 is in contact with the side surfaces of the stopper layer 30, and its top surface is flat, or in a dishing form.

Figure 35:
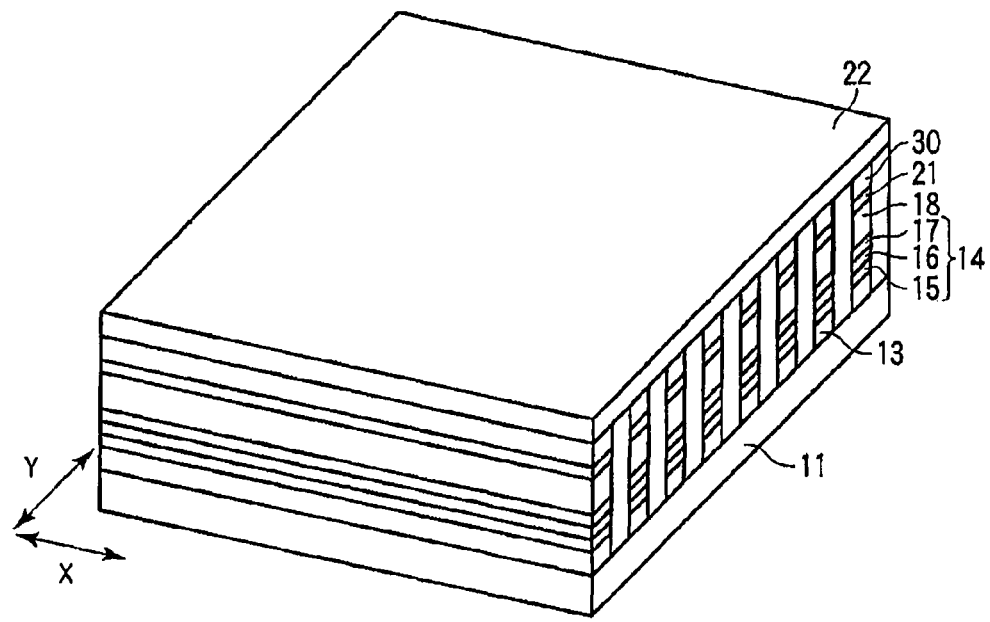
FIG. 35 is a perspective view showing a manufacturing process of the resistance variation type memory according to the second embodiment.

Next, as shown in FIG. 35, the second wiring layer 22 is deposited on the interlayer insulator 20. At this time, as the top surface of the interlayer insulator 20 has already been planarized by the process of FIG. 34, it is possible to deposit the conductive material acting as the second wiring layer 22, even in the event of using a conductive material with poor coverage. Also, it is possible to deposit the second wiring layer 22 with good throughput using a membrane formation method, for example, the PVD method or sputtering method, whose deposition rate is higher than its reaction rate control.

Figure 36:
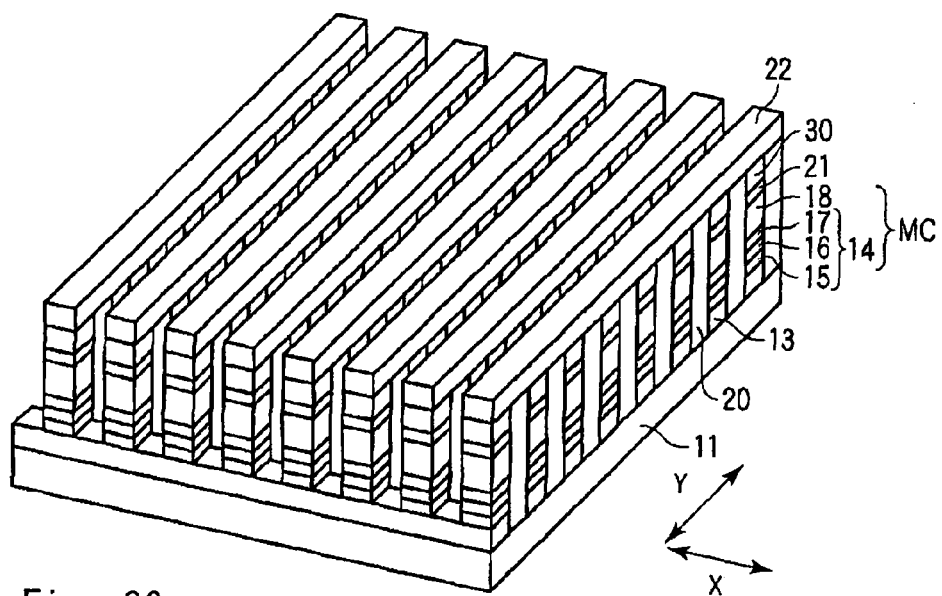
FIG. 36 is a perspective view showing a manufacturing process of the resistance variation type memory according to the second embodiment.

Next, as shown in FIG. 36, the second wiring layer 22 is processed into linear forms using the lithography and anisotropic RIE method, and furthermore, an etching is carried out until the top surface of the first wiring layer 13 is exposed. By this means, a plurality of pillar-shaped memory cells are formed on the first wiring layer 13, and furthermore, a plurality of second wiring layers 22, each extending in the Y direction, are formed on the stopper layer 30.

Figure 37:
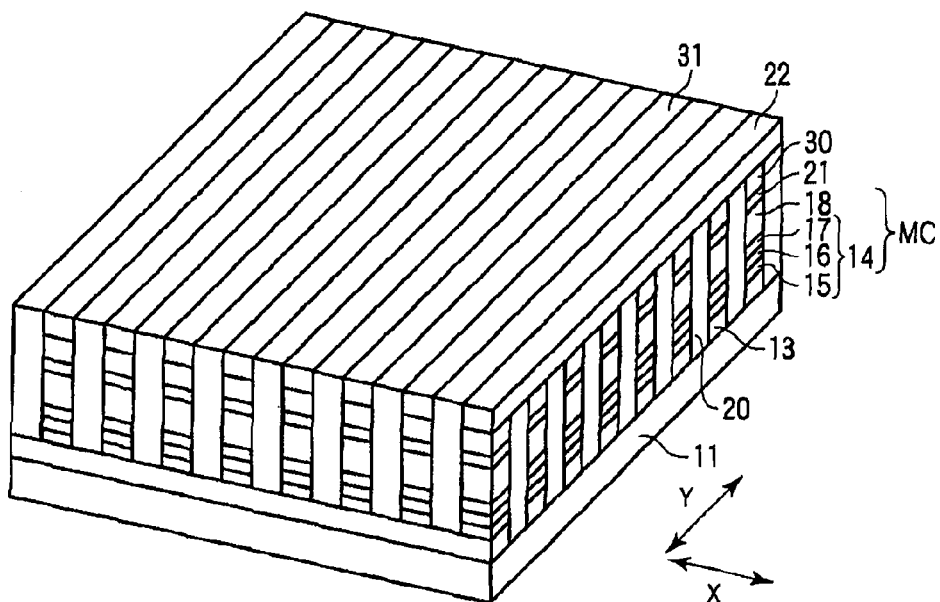
FIG. 37 is a perspective view showing a manufacturing process of the resistance variation type memory according to the second embodiment.

Next, as shown in FIG. 37, the interlayer insulator 31 is embedded between the linear laminated bodies. Then, the top surface of the interlayer insulator 31 is planarized using the CMP method. By this means, the interlayer insulator 31 is in contact with the side surfaces of the stopper layer 30 and second wiring layer 22, and its top surface is flat, or in a dishing form. By so doing, the resistance variation type memory which has the crosspoint type array structure shown in FIGS. 28 to 30 is formed.

In the embodiment, by processing the laminated membranes including the diode 18 and variable resistance element 14 into linear forms in one direction at the same wiring pitch as the first wiring layer 13, then processing them into linear forms in a direction perpendicular to the first wiring layer 13 at the same wiring pitch as the second wiring layer 22, a plurality of pillar-shaped memory cells MC are formed. Therefore, with the manufacturing method of this embodiment, as it is possible to use a lithography with a linear repeated structure, which can form a denser structure, it is possible to form a memory cell array which is denser than in the case of forming the pillar-shaped memory cells with a one time lithography, as in the first embodiment.

Also, the pillar-shaped structure is formed by the lithography and patterning forming the first wiring layer 13, and the lithography and patterning forming the second wiring layer 22. This is clear from the fact that, as shown in FIGS. 29 and 30, the pillar-shaped structure including the memory cell MC is in contact with the side walls of the interlayer insulator 20 in the Y direction, and in contact with the side walls of the interlayer insulator 31 in the X direction. Therefore, there being no misalignment of the pillar-shaped structure with the first wiring layer 13 and second wiring layer 22, it is possible to form the memory cell MC with the pillar-shaped structure so as to be self-aligning with the wiring structure. That is, two sides of the stopper layer 30 are formed so as to be self-aligning with two sides of the first wiring layer 13, while the other two sides of the stopper layer 30 are formed so as to be self-aligning with two sides of the second wiring layer 22.

In the embodiment, as the processing of all the layers configuring the resistance variation type memory is carried out using the RIE method, each layer has a tapered shape which narrows toward the top.

Also, it also naturally being acceptable that a manufacturing method, such as is described in JP-A-8-55908, using a pitch twice that of a process limit pitch of a lithography used in the side wall processing, is used in the linear patterning, by using this manufacturing method, it is possible to form a denser crosspoint type array structure.

As heretofore described in detail, with this embodiment, it is possible to prevent a short circuit arising from the remains of the barrier metal 21, diode 18, or upper electrode 17. By this means, it is possible to prevent the problem wherein a leakage current, occurring due to a large voltage being applied between the second wiring layers 22, increases. Other advantages are the same as those in the first embodiment.

It is also acceptable that the second wiring layer 22 is configured of a damascene wiring, in the same way as in the second modification example of the first embodiment.

Modification Example

Figure 38:
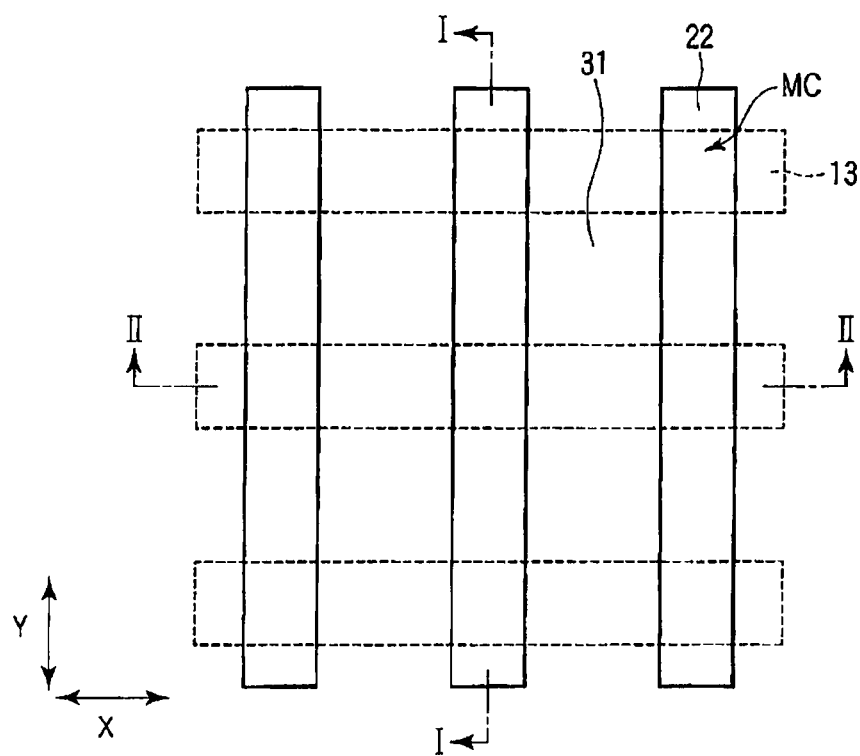
FIG. 38 is a plan view showing a configuration of a resistance variation type memory according to a modification example.
Figure 39:
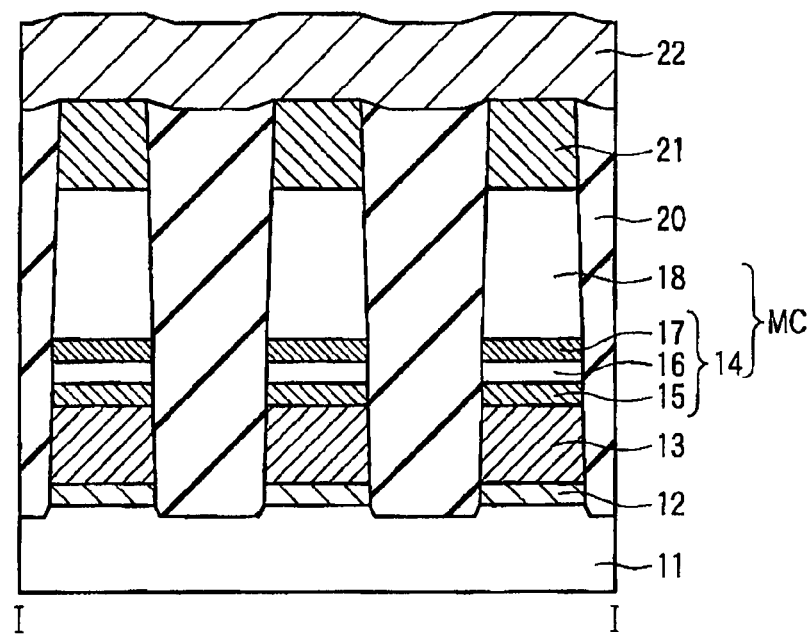
FIG. 39 is a sectional view showing a configuration of a resistance variation type memory along a line I-I shown in FIG. 38.
Figure 40:
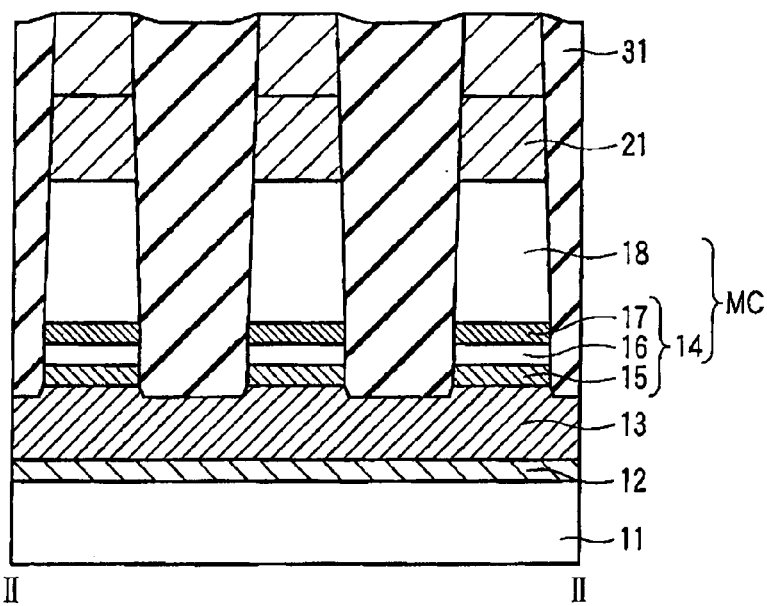
FIG. 40 is a sectional view showing the configuration of the resistance variation type memory along a line II-II shown in FIG. 38.

FIG. 38 is a plan view showing a configuration of a resistance variation type memory according to a modification example. FIG. 39 is a sectional view showing a configuration of a resistance variation type memory along a line I-I shown in FIG. 38. FIG. 40 is a sectional view showing a configuration of a resistance variation type memory along a line II-II shown in FIG. 38.

In this modification example, the CMP stopper layer 30 shown in FIG. 29 is omitted. Then, as shown in FIG. 39, by depositing the barrier metal 21 more thickly than a thickness which fulfils the function as a barrier, the barrier metal 21 is given a role as an interlayer insulator 20 CMP stopper. The barrier metal 21 being configured of a single layer in the in-plane direction, side surfaces thereof are in contact with the interlayer insulator 20. Also, using a CPM process which uses the barrier metal 21 as a stopper, the top surface of the interlayer insulator 20 takes on a flat or dishing form.

Also, the interlayer insulator 31 is in contact with the side surfaces of the barrier metal 21. Using a CPM process which uses the second wiring layer 22 as a stopper, the top surface of the interlayer insulator 31 takes on a flat or dishing form.

The hardness of the barrier metal 21 used as the CMP stopper is set high. By making the hardness of the barrier metal 21 high, it is possible to stop the interlayer insulator 20 CMP process at the top surface of the barrier metal 21. As a material of this kind of barrier metal 21, titanium nitride, titanium aluminum nitride, tantalum nitride, tungsten nitride, or the like, is proposed.

Apart from omitting the CMP stopper layer 30, and depositing the barrier metal 21 thickly, the manufacturing method of the modification example is the same as that of the second embodiment.

Consequently, with the modification example, it is possible to omit the process of depositing the material configuring the CMP stopper layer 30, and the etching process. Also, as it is possible to make the thickness of the barrier metal 21 of FIG. 39 less than the combined thickness of the barrier metal 21 and stopper layer 30 of FIG. 29, it is possible to further reduce the aspect ratio.

Third Embodiment

In a third embodiment, the laminating order of the variable resistance element 14 and non-ohmic element 18 being the reverse of that of the second embodiment, the variable resistance element 14 is disposed on the non-ohmic element 18.

Figure 41:
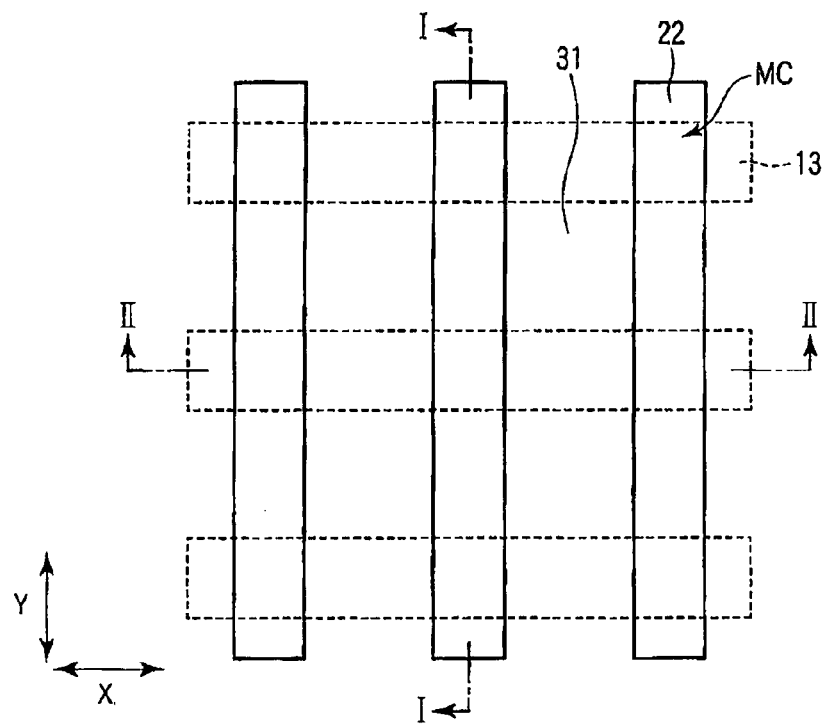
FIG. 41 is a perspective view showing the configuration of the resistance variation type memory according to the third embodiment.
Figure 42:
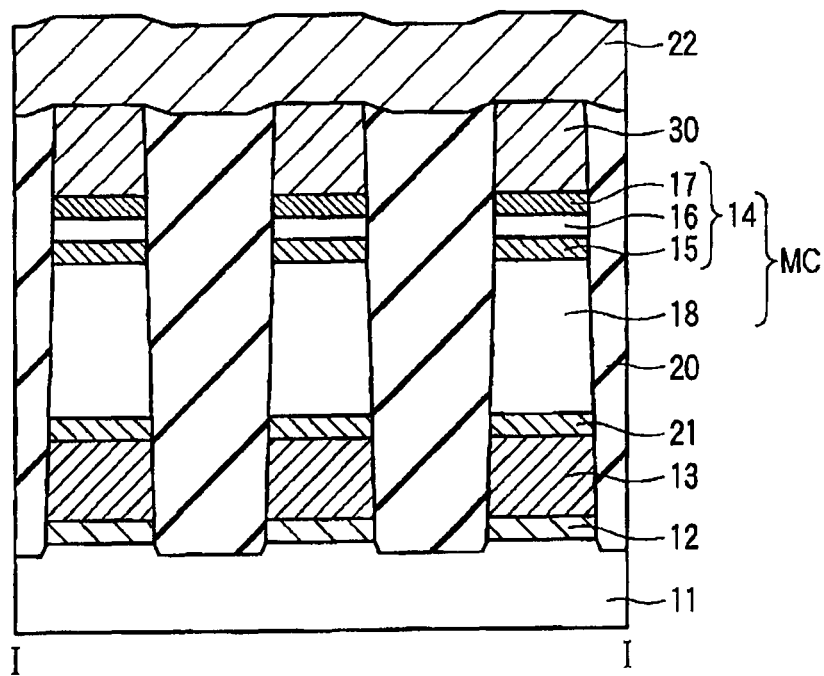
FIG. 42 is a sectional view showing a configuration of a resistance variation type memory along a line I-I shown in FIG. 41.
Figure 43:
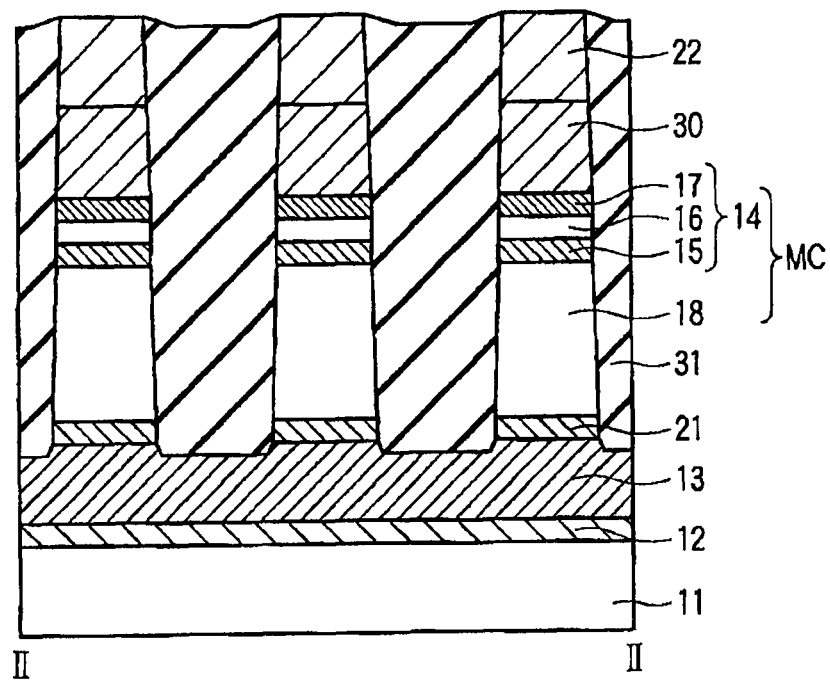
FIG. 43 is a sectional view showing the configuration of the resistance variation type memory along a line II-II shown in FIG. 41.

FIG. 41 is a plan view showing a configuration of a resistance variation type memory according to a third embodiment. FIG. 42 is a sectional view showing a configuration of a resistance variation type memory along a line I-I shown in FIG. 41. FIG. 43 is a sectional view showing a configuration of a resistance variation type memory along a line II-II shown in FIG. 41.

The barrier metal 12 is provided on the interlayer insulator 11. The first wiring layer 13 is provided on the barrier metal 12. The first wiring layer 13 is formed in a linear form in such a way as to extend in the X direction.

The pillar-shaped memory cell MC (including the variable resistance element 14, and non-ohmic element 18) is provided, across the barrier metal 21, on the first wiring layer 13. Specifically, the pillar-shaped barrier metal 21 is provided on the first wiring layer 13. The non-ohmic element (for example, a diode) 18 is provided on the barrier metal 21. The barrier metal 21 functions as a barrier between the first wiring layer 13 and diode 18, and as a bonding layer.

The variable resistance element 14, in which the lower electrode 15, recording layer 16, and upper electrode 17 are laminated in order, is provided on the diode 18. The stopper layer 30, which is used as a stopper in the interlayer insulator CMP process, is provided on the variable resistance element 14. A plurality of linear second wiring layers 22, each extending in the Y direction, are provided on the stopper layer 30.

The interlayer insulator 20 and interlayer insulator 31 are provided between the pillar-shaped laminated bodies (the barrier metal 21, memory cell MC, and stopper layer 30). That is, the interlayer insulator 20 is provided between adjacent laminated bodies in the Y direction. The interlayer insulator 31 is provided between adjacent laminated bodies in the X direction. The barrier metal 21 and stopper layer 30 each being configured in a single layer in the in-plane direction, the side surfaces thereof are in contact with the interlayer insulator 20 and interlayer insulator 31. As shown in FIG. 29, the position of the top surface of the stopper layer 30 and the position of the top surface of the interlayer insulator 20 are the same. Also, the interlayer insulator 20 is provided between the first wiring layers 13. The interlayer insulator 31 is provided between the second wiring layers 22.

The materials of each layer configuring the resistance variation type memory of the third embodiment are the same as those of the first embodiment. In this way, the resistance variation type memory of this embodiment is configured.

Next, a description will be given of one example of a manufacturing method of the resistance variation type memory according to this embodiment. The resistance variation type memory according to the third embodiment is formed by reversing the laminating order of the variable resistance element 14, diode 18, and barrier metal 21 of the second embodiment.

As far as depositing the interlayer insulator 11 made of, for example, silicon oxide or silicon nitride, on the FEOL structure, the manufacturing method is the same as FIG. 31 of the second embodiment. Next, the barrier metal 12, first wiring layer 13, barrier metal 21, diode 18, variable resistance element 14 (the lower electrode 15, recording layer 16, and upper electrode 17), and stopper layer 30 are deposited in order on the interlayer insulator 11.

In the event that the low resistance metal (for example, tungsten copper, cobalt, or nickel) configuring the previously formed first wiring layer 13 diffuses into the diode 18 configured of a semiconductor, it forms a deep level, and becomes a carrier trapping level, whereon the rectifying property of the diode deteriorates. For this reason, for example, titanium nitride, titanium, or tantalum nitride, which configures the barrier metal 21, is deposited to a thickness of, for example, 2 to 50 nm, after the formation of the first wiring layer 13, so that the first wiring layer 13 and diode 18 do not come into direct contact. Subsequent manufacturing processes are the same as those in the second embodiment.

The interlayer insulator 20 is in contact with the side surfaces of the stopper layer 30. Also, using a CPM process which uses the stopper layer 30 as a stopper, the top surface of the interlayer insulator 20 takes on a flat or dishing form. In the same way, the interlayer insulator 31 is in contact with the side surfaces of the stopper layer 30. Also, using a CPM process which uses the second wiring layer 22 as a stopper, the top surface of the interlayer insulator 31 takes on a flat or dishing form.

In this way, with the third embodiment, it is possible to prevent a short circuit arising from the remains of the barrier metal 21, diode 18, or upper electrode 17. By this means, it is possible to prevent the problem wherein a leakage current, occurring due to a large voltage being applied between the second wiring layers 22, increases.

Also, in the third embodiment, the variable resistance element 14 is formed after the diode 18 is formed. Therefore, it is possible to insert a thermal activation anneal, for activating a donor impurity or acceptor impurity for forming a PN junction or Schottky junction included in the diode 18, after forming the diode 18 and before laminating the variable resistance element 14. By this means, it is possible to form a diode 18 with a further improved rectifying property. Other advantages are the same as those in the second embodiment.

The third embodiment can also be applied to the first embodiment.

Modification Example

Figure 44:
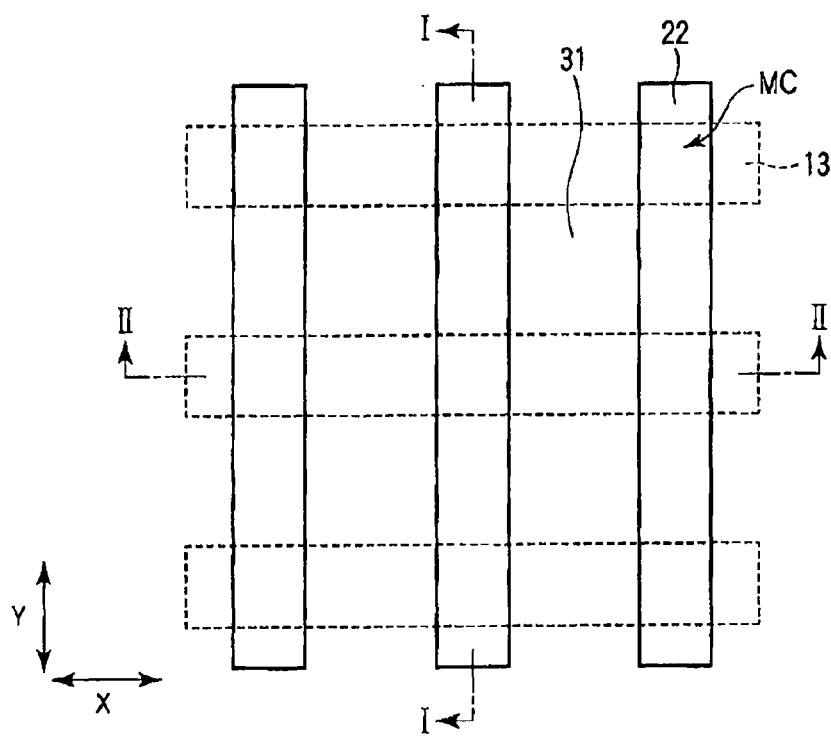
FIG. 44 is a plan view showing a configuration of a resistance variation type memory according to a modification example.
Figure 45:
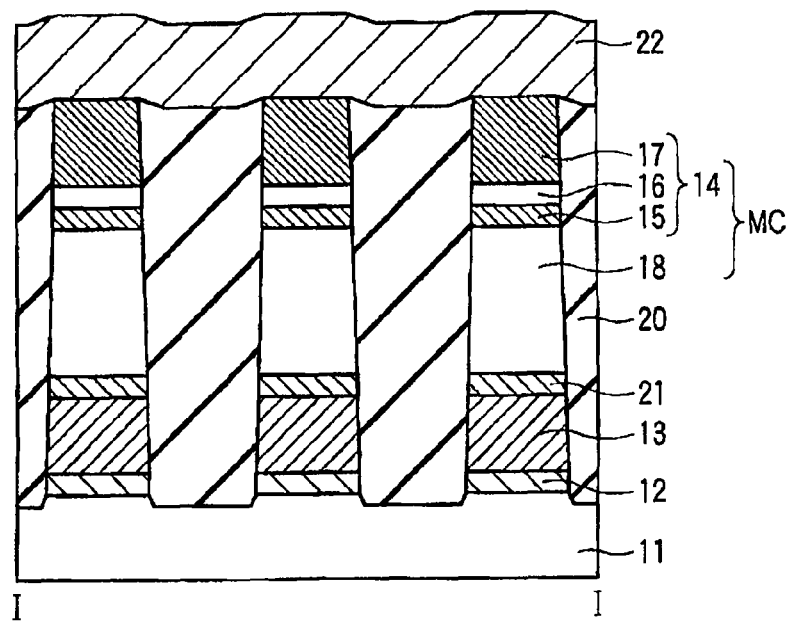
FIG. 45 is a sectional view showing a configuration of a resistance variation type memory along a line I-I shown in FIG. 44.
Figure 46:
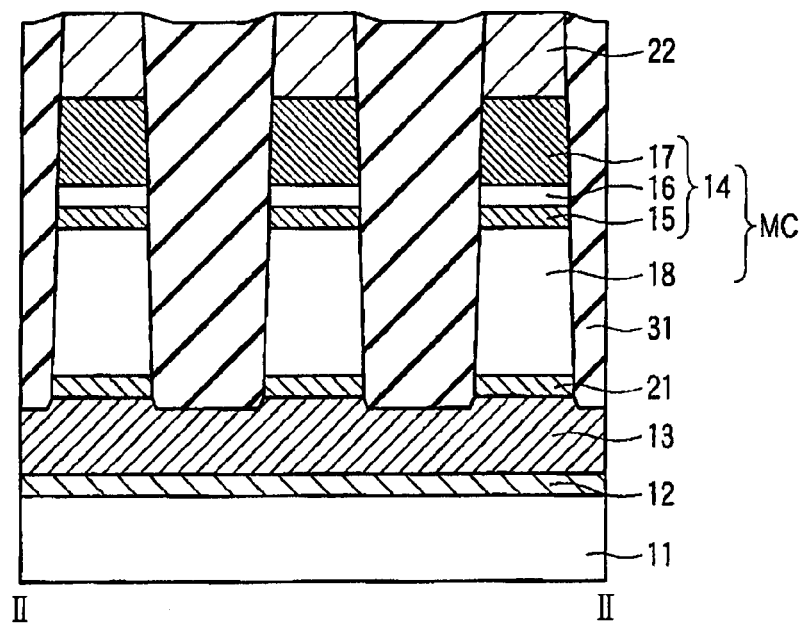
FIG. 46 is a sectional view showing the configuration of the resistance variation type memory along a line II-II shown in FIG. 44.

FIG. 44 is a plan view showing a configuration of a resistance variation type memory according to a modification example. FIG. 45 is a sectional view showing a configuration of a resistance variation type memory along a line I-I shown in FIG. 44. FIG. 46 is a sectional view showing a configuration of a resistance variation type memory along a line II-II shown in FIG. 44.

In this modification example, the CMP stopper layer 30 shown in FIG. 42 is omitted. Then, by depositing the upper electrode 17 included in the variable resistance element 14 more thickly than in the second embodiment when creating the crosspoint type array structure of the third embodiment, as shown in FIG. 45, the upper electrode 17 is given a role as an interlayer insulator 20 CMP stopper. The upper electrode 17 being configured of a single layer in the in-plane direction, side surfaces thereof are in contact with the interlayer insulator 20. Also, using a CPM process which uses the upper electrode 17 as a stopper, the top surface of the interlayer insulator 20 takes on a flat or dishing form.

Also, the interlayer insulator 31 is in contact with the side surfaces of the upper electrode 17. Using a CPM process which uses the second wiring layer 22 as a stopper, the top surface of the interlayer insulator 31 takes on a flat or dishing form. The hardness of the upper electrode 17 used as the CMP stopper is set high. By making the hardness of the upper electrode 17 high, it is possible to stop the interlayer insulator 20 CMP process at the top surface of the upper electrode 17. As a material of this kind of upper electrode 17, titanium nitride, titanium aluminum nitride, tantalum nitride, tungsten nitride, or the like, is proposed.

Apart from omitting the CMP stopper layer 30, and depositing the upper electrode 17 thickly, the manufacturing method of the modification example is the same as that of the third embodiment. Consequently, with the modification example, it is possible to omit the process of depositing the material configuring the CMP stopper layer 30, and the etching process. Also, as it is possible to make the thickness of the upper electrode 17 of FIG. 45 less than the combined thickness of the upper electrode 17 and stopper layer 30 of FIG. 42, it is possible to further reduce the aspect ratio.

Fourth Embodiment

In a fourth embodiment, a crosspoint type array structure is laminated in two levels by laminating two memory cells in a vertical direction. That is, a resistance variation type memory according to the fourth embodiment has a memory cell array with a three-dimensional structure.

Figure 47:
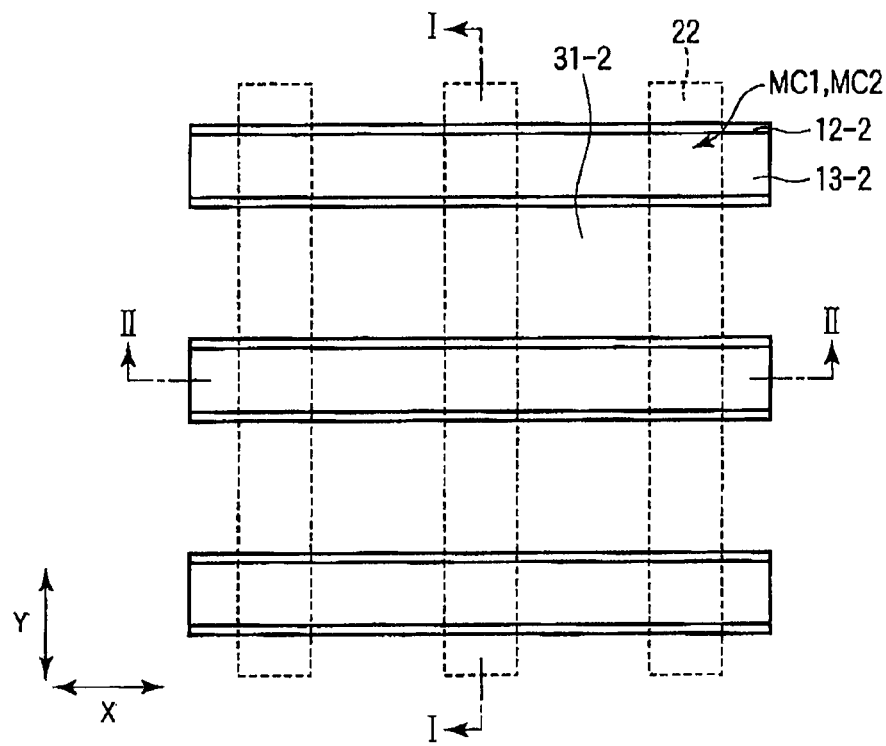
FIG. 47 is a perspective view showing the configuration of the resistance variation type memory according to the fourth embodiment.
Figure 48:
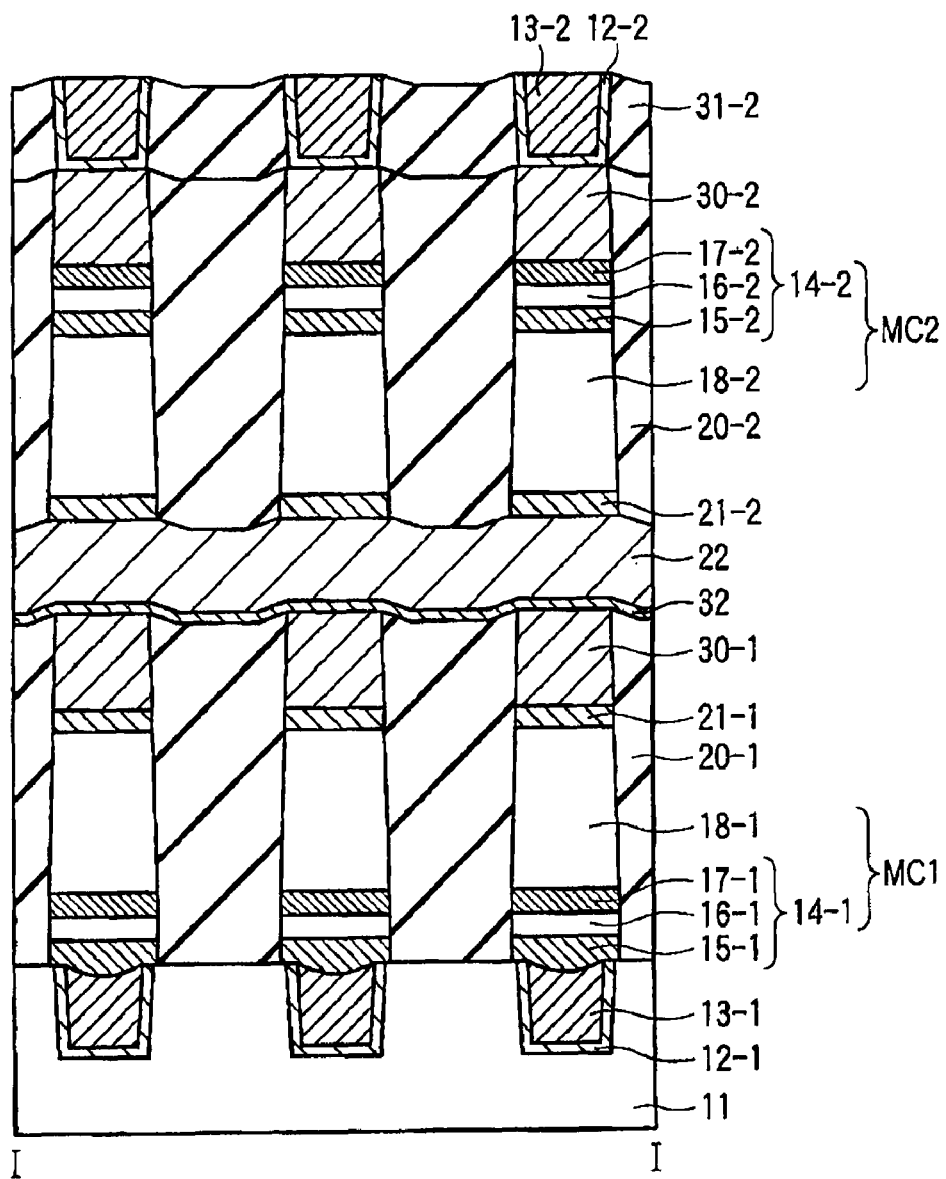
FIG. 48 is a sectional view showing a configuration of a resistance variation type memory along a line I-I shown in FIG. 47.
Figure 49:
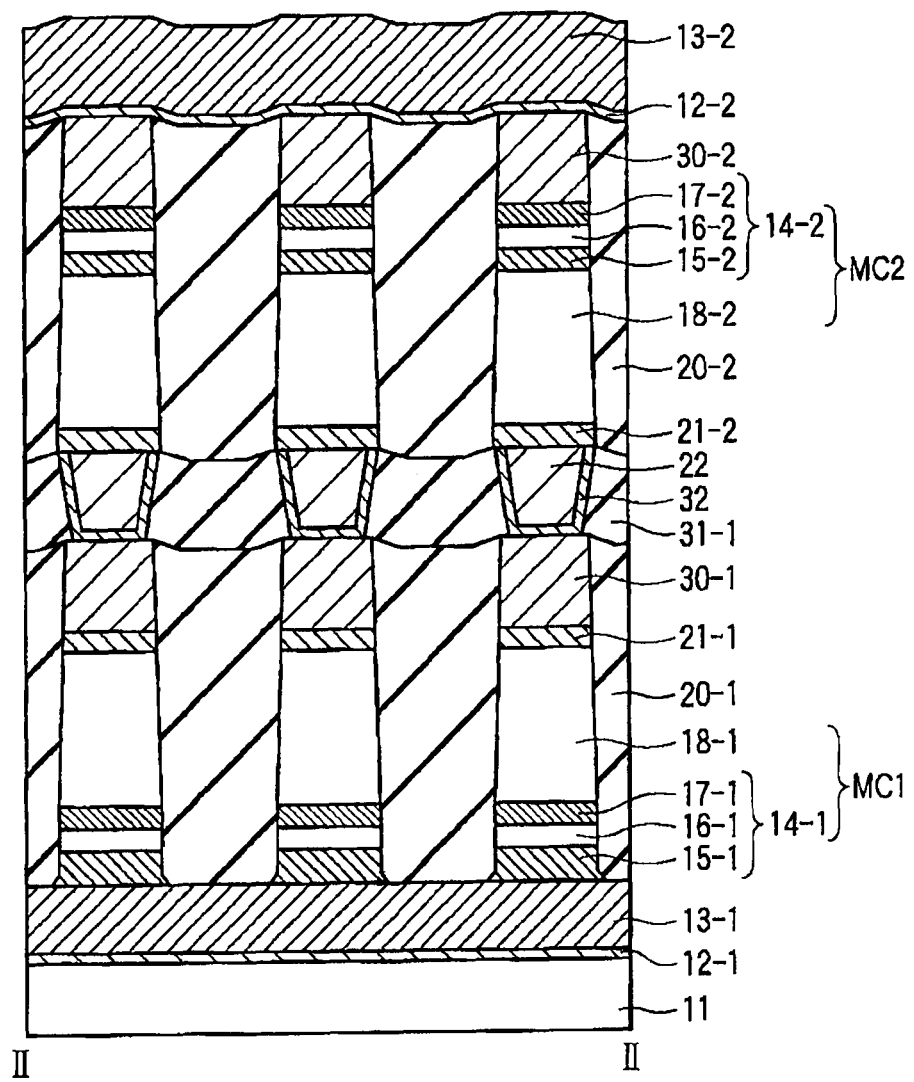
FIG. 49 is a sectional view showing the configuration of the resistance variation type memory along a line II-II shown in FIG. 47.

FIG. 47 is a plan view showing a configuration of a resistance variation type memory according to a fourth embodiment. FIG. 48 is a sectional view showing a configuration of a resistance variation type memory along a line I-I shown in FIG. 47. FIG. 49 is a sectional view showing a configuration of a resistance variation type memory along a line II-II shown in FIG. 47.

A first level crosspoint type array structure is provided on the interlayer insulator 11. This crosspoint type array structure is of the same configuration as that in the first embodiment. A memory cell included in the first level crosspoint type array structure is designated as "MC1". The memory cell MC1 includes a variable resistance element 14-1, and a non-ohmic element (for example, a diode) 18-1.

A barrier metal 21-1 is provided on the memory cell MC1. A stopper layer 30-1, which is used as a stopper in an interlayer insulator 20-1 CMP process, is provided on the barrier metal 21-1. A plurality of linear second wiring layers (word lines) 22, each extending in the Y direction, are provided on the stopper layer 30-1.

A second level crosspoint type array structure is provided on the second wiring layer 22. That is, a pillar-shaped memory cell MC2 (including a variable resistance element 14-2, and a non-ohmic element 18-2) is provided on the second wiring layer 22.

Specifically, a pillar-shaped barrier metal 21-2 is provided on the second wiring layer 22. The non-ohmic element (for example, a diode) 18-2 is provided on the barrier metal 21-2. The barrier metal 21-2 functions as a barrier between the second wiring layer 22 and the diode 18-2, and as a bonding layer.

The variable resistance element 14-2, in which a lower electrode 15-2, recording layer 16-2, and upper electrode 17-2 are laminated in order, is provided on the diode 18-2. A stopper layer 30-2, which is used as a stopper in the interlayer insulator CMP process, is provided on the variable resistance element 14-2. A plurality of linear third wiring layers (bit lines) 13-2, each extending in the X direction, are provided on the stopper layer 30-2. The side surfaces and bottom surface of each third wiring layer 13-2 are covered with a barrier metal 12-2. The first wiring layer 13-1, second wiring layer 22, and third wiring layer 13-2 are each configured of a damascene wiring. Therefore, these wiring layers have a tapered shape which widens toward the top.

The interlayer insulator 20-1 is provided between the pillar-shaped first level laminated bodies (the memory cell MC1, barrier metal 21-1, and stopper layer 30-1). An interlayer insulator 31-1 is provided between the second wiring layers 22. The stopper layer 30-1 being configured of a single layer in the in-plane direction, side surfaces thereof are in contact with the interlayer insulator 20-1. The position of the top surface of the stopper layer 30-1 is the same as the position of the top surface of the interlayer insulator 20-1, as shown in FIG. 48. Also, using a CPM process which uses the stopper layer 30-1 as a stopper, the top surface of the interlayer insulator 20-1 takes on a flat or dishing form.

An interlayer insulator 20-2 is provided between the pillar-shaped second level laminated bodies (the barrier metal 21-2, memory cell MC2, and stopper layer 30-2). An interlayer insulator 31-2 is provided between the third wiring layers 13-2. The stopper layer 30-2 being configured of a single layer in the in-plane direction, side surfaces thereof are in contact with the interlayer insulator 20-2. The position of the top surface of the stopper layer 30-2 is the same as the position of the top surface of the interlayer insulator 20-2, as shown in FIG. 48. Also, using a CPM process which uses the stopper layer 30-2 as a stopper, the top surface of the interlayer insulator 20-2 takes on a flat or dishing form.

A manufacturing method of the resistance variation type memory according to the fourth embodiment is such that the first level array structure and second level array structure can each be realized by using the same manufacturing method as in the first embodiment. With the resistance variation type memory configured in this way too, it is possible to obtain the same advantages as in the first embodiment. It is also possible to apply the same manufacturing method as in the second embodiment to the fourth embodiment. Also, it is also acceptable to configure in such a way that the stopper layer 30-1 is omitted, and the barrier metal 21-1 is made thick, in the same way as in the first embodiment. Furthermore, it is also acceptable to configure in such a way that the stopper layer 30-2 is omitted, and the upper electrode 17-2 is made thick, in the same way as in the third embodiment.

Also, in the fourth embodiment, the diodes 18-1 and 18-2 are disposed in such a way as to face each other across the second wiring layer 22, but it is also acceptable, by reversing the laminating order of the diode and variable resistance element in each of the memory cells MC1 and MC2, to dispose in such a way that the variable resistance elements 14-1 and 14-2 face each other across the second wiring layer 22. Specifically, the memory cell MC1 is configured by the diode 18-1 and variable resistance element 14-1 being laminated, in order from the bottom, and the memory cell MC2 is configured by the variable resistance element 14-2 and diode 18-2 being laminated, in order from the bottom, on the barrier metal 12-1. Then, the barrier metal 12-2 is formed on the diode 18-2.

Fifth Embodiment

In a fifth embodiment, in the same way as in the fourth embodiment, a crosspoint type array structure is laminated in two levels by laminating two memory cells in a vertical direction. That is, a resistance variation type memory according to the fifth embodiment has a memory cell array with a three-dimensional structure. Furthermore, in the fifth embodiment, unlike the fourth embodiment, the laminating order of the variable resistance element 14 and diode 18 included in each of the first level memory cell MC1 and second level memory cell MC2 is the same.

Figure 50:
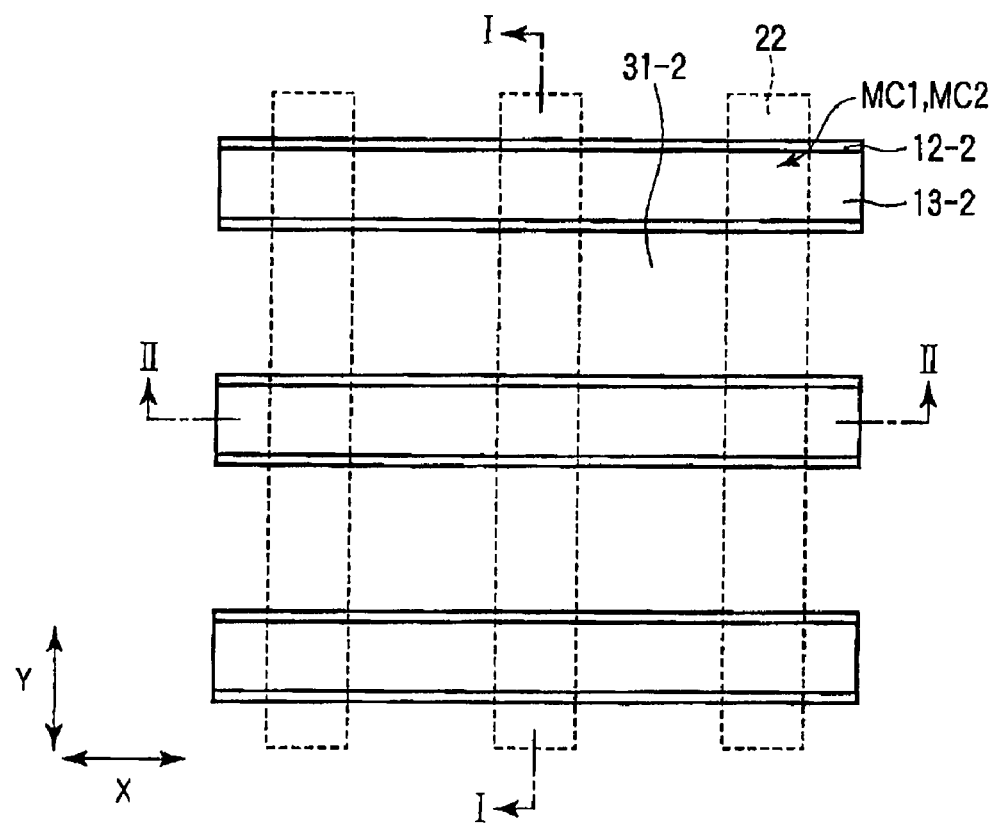
FIG. 50 is a perspective view showing the configuration of the resistance variation type memory according to the fifth embodiment.
Figure 51:
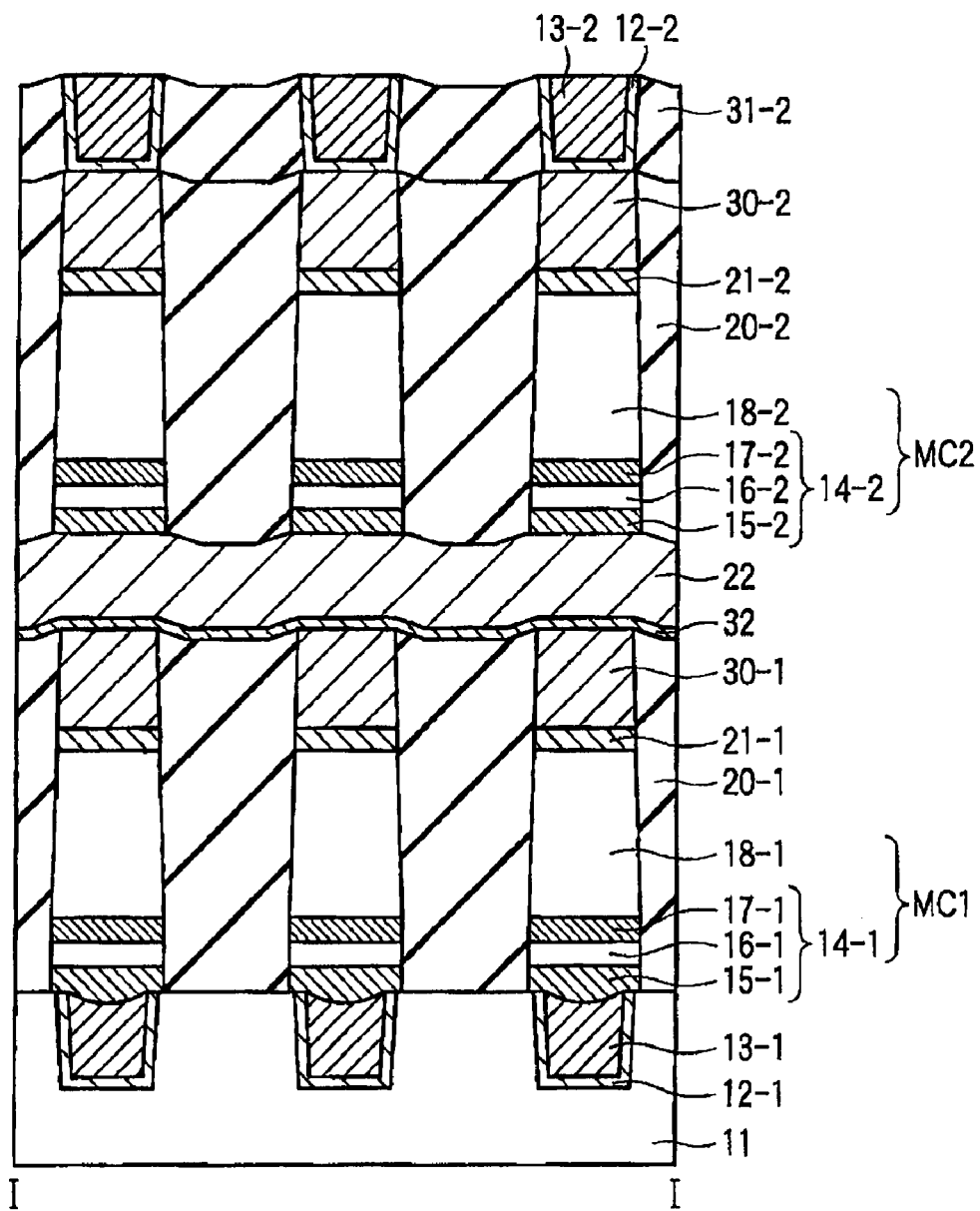
FIG. 51 is a sectional view showing a configuration of a resistance variation type memory along a line I-I shown in FIG. 50.
Figure 52:
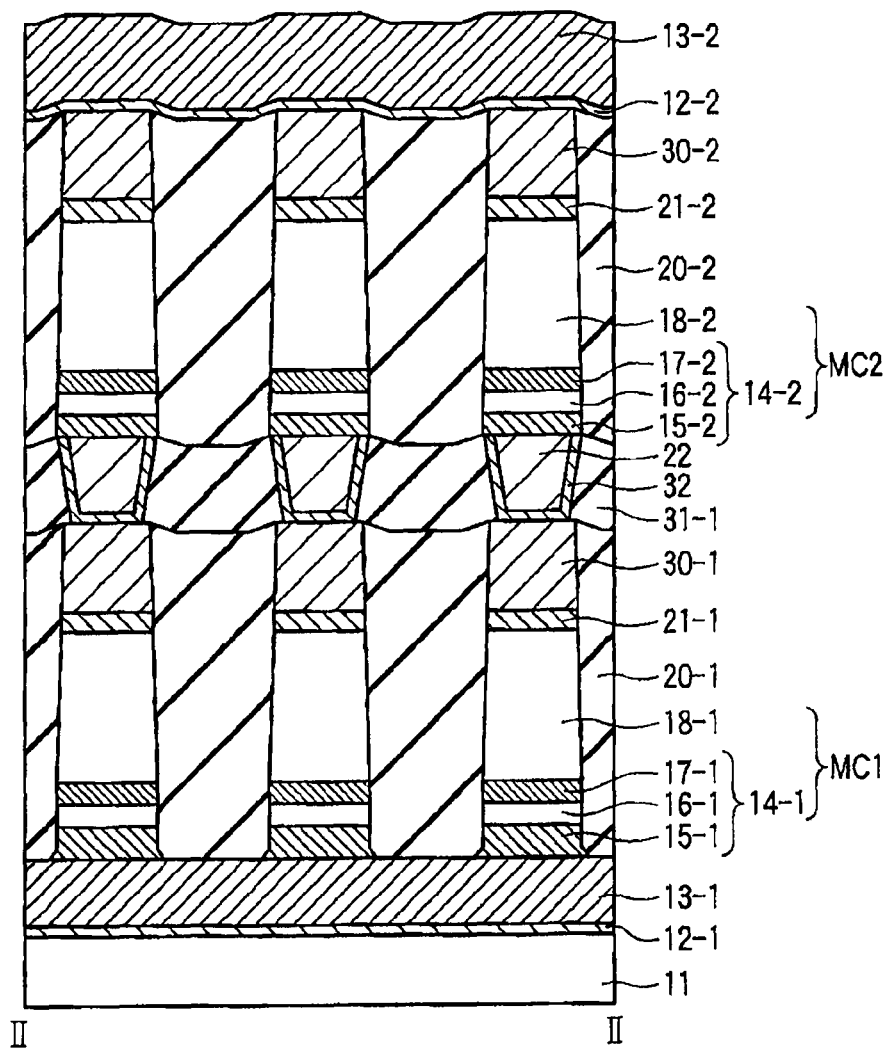
FIG. 52 is a sectional view showing the configuration of the resistance variation type memory along a line II-II shown in FIG. 50.

FIG. 50 is a plan view showing a configuration of a resistance variation type memory according to a fifth embodiment. FIG. 51 is a sectional view showing a configuration of a resistance variation type memory along a line I-I shown in FIG. 50. FIG. 52 is a sectional view showing a configuration of a resistance variation type memory along a line II-II shown in FIG. 50.

A first level crosspoint type array structure is provided on the interlayer insulator 11. This crosspoint type array structure is of the same configuration as that in the first embodiment.

A second level crosspoint type array structure is provided on the second wiring layer 22. That is, the pillar-shaped memory cell MC2 (including the variable resistance element 14-2, and the non-ohmic element 18-2) is provided on the second wiring layer 22.

Specifically, the pillar-shaped variable resistance element 14-2, in which the lower electrode 15-2, recording layer 16-2, and upper electrode 17-2 are laminated in order, is provided on the second wiring layer 22. The non-ohmic element (for example, a diode) 18-2 is provided on the upper electrode 17-2. The barrier metal 21-2 is provided on the diode 18-2. The stopper layer 30-2, which is used as a stopper in the interlayer insulator CMP process, is provided on the barrier metal 21-2. A plurality of linear third wiring layers (bit lines) 13-2, each extending in the X direction, are provided on the stopper layer 30-2. The side surfaces and bottom surface of each third wiring layer 13-2 are covered with the barrier metal 12-2. The first wiring layer 13-1, second wiring layer 22, and third wiring layer 13-2 are each configured of a damascene wiring. Therefore, these wiring layers have a tapered shape which widens toward the top.

A manufacturing method of the resistance variation type memory according to the fifth embodiment is such that the first level array structure and second level array structure can each be realized by using the same manufacturing method as in the first embodiment.

With the resistance variation type memory configured in this way too, it is possible to obtain the same advantages as in the first embodiment. It is also possible to apply the same manufacturing method as in the second embodiment to the fifth embodiment. Also, it is also acceptable to configure in such a way that the stopper layers 30-1 and 30-2 are omitted, and the barrier metals 21-1 and 21-2 are made thick, in the same way as in the first embodiment.

Also, in the fifth embodiment, the memory cells MC1 and MC2 are each configured by a variable resistance element and a diode being laminated, in order from the bottom, but it is also acceptable that the laminating order of the variable resistance element and diode is reversed. Specifically, the memory cells MC1 and MC2 are each configured by the diode 18 and variable resistance element 14 being laminated, in order from the bottom, on the barrier metal 12.

Sixth Embodiment

A memory cell MC is formed in a pillar shape, a lower extreme of the memory cell MC is electrically connected to the first wiring layer 13, and an upper extreme of the memory cell MC is electrically connected to the second wiring layer 22. In the case of this kind of configuration, there is a possibility of a misalignment of the first wiring layer 13 and memory cell MC, and a misalignment of the memory cell MC and second wiring layer 22, occurring in the manufacturing process. A sixth embodiment, adopting a structure such that a wiring connection is well maintained even in the event of a wiring layer misalignment occurring, and a short circuit is unlikely to occur between a first memory cell and a wiring connected to a second memory cell adjacent to the first memory cell, even when miniaturized, realizes a non-volatile memory cell array which can maintain reliability.

Figure 53:
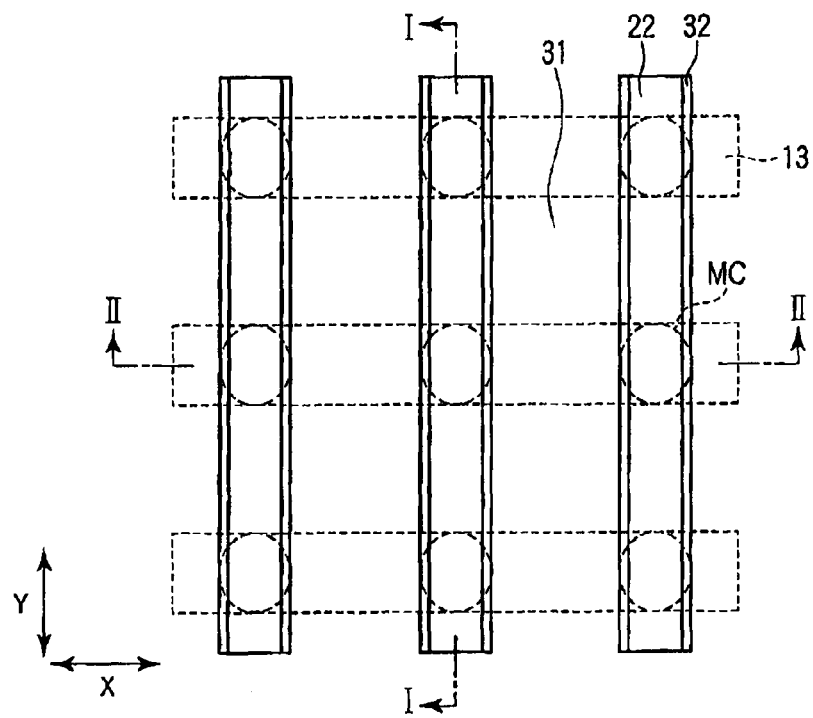
FIG. 53 is a perspective view showing the configuration of the resistance variation type memory according to the sixth embodiment.
Figure 54:
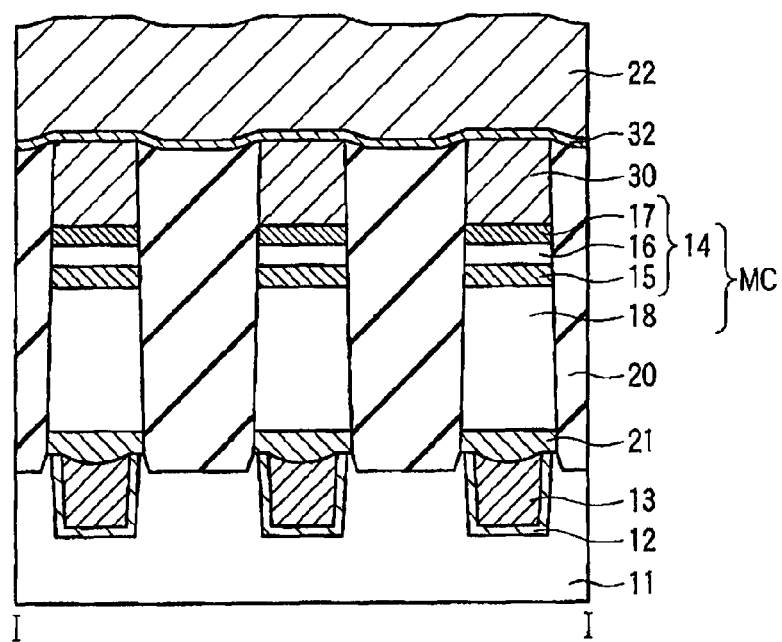
FIG. 54 is a sectional view showing a configuration of a resistance variation type memory along a line I-I shown in FIG. 53.
Figure 55:
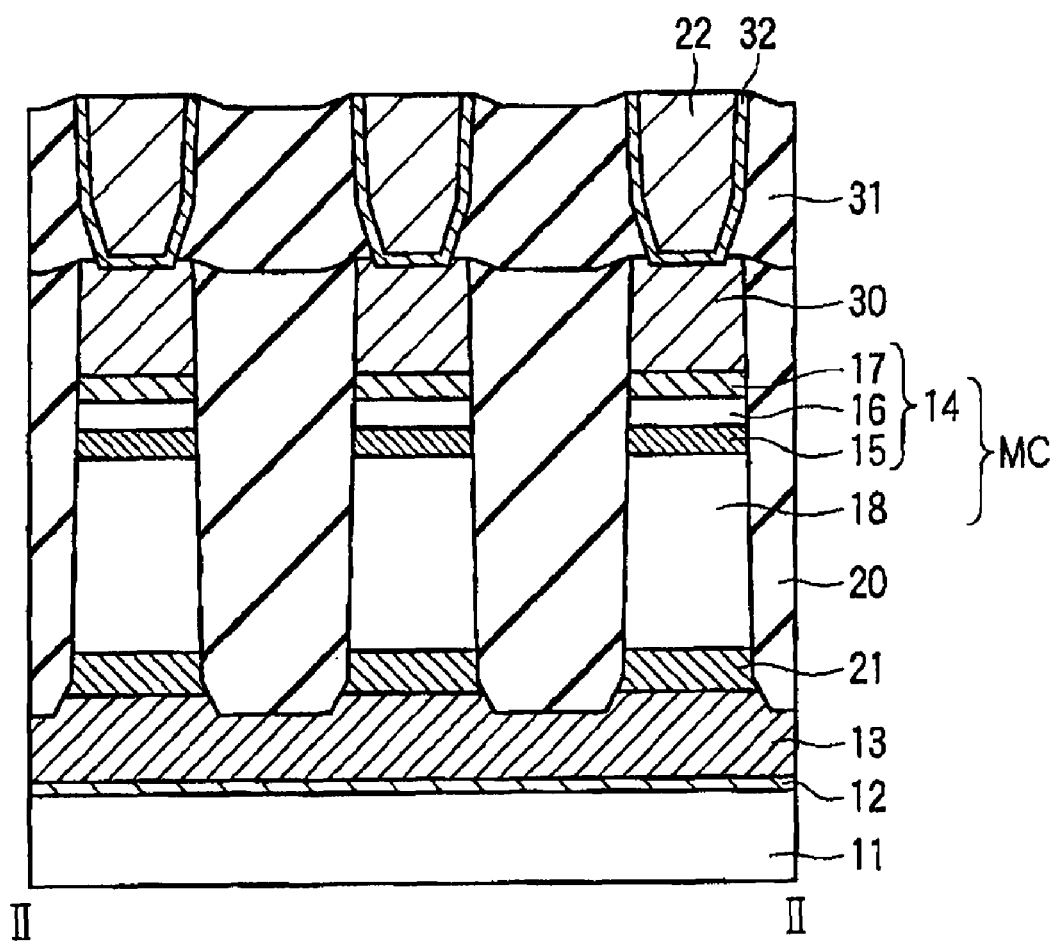
FIG. 55 is a sectional view showing the configuration of the resistance variation type memory along a line II-II shown in FIG. 53.

FIG. 53 is a plan view showing a configuration of a resistance variation type memory according to a sixth embodiment. FIG. 54 is a sectional view showing a configuration of a resistance variation type memory along a line I-I shown in FIG. 53. FIG. 55 is a sectional view showing a configuration of a resistance variation type memory along a line II-II shown in FIG. 53.

Although there is no particular limitation on a planar shape of the memory cell MC, in this embodiment, a case in which the planar shape of the memory cell MC is a circle is shown as one example. The first wiring layer 13 and second wiring layer 22 are each configured of a damascene wiring. The bottom surface and side surfaces of the first wiring layer 13 are covered with the barrier metal 12. The bottom surface and side surfaces of the second wiring layer 22 are covered with the barrier metal 32.

Apart from the membrane formation order of the variable resistance element 14 and diode 18 being reversed, a manufacturing method of the sixth embodiment is the same as that in FIGS. 15 to 19 used in the description of the manufacturing method of the first embodiment. Therefore, a description will be given referring to FIGS. 15 to 19 for the manufacturing method of the sixth embodiment too.

Firstly, as far as the depositing of the interlayer insulator 11 after the FEOL process, the manufacturing method is the same as the manufacturing process of FIG. 15. Next, as shown in FIG. 16, a plurality of first wiring layers 13 are formed, using the damascene method, in the interlayer insulator 11. That is, performing a lithography and patterning on the interlayer insulator 11 in the extension direction of the first wiring layers 13, an etching is carried out within a range of, for example, 50 to 300 nm. The barrier metals 12 (not shown) are deposited, using the CVD method, to a thickness of 2 to 50 nm in grooves made in this way, and next, the first wiring layers 13 are deposited, using the CVD method, to a thickness of 50 to 500 nm. Furthermore, the first wiring layers 13 and barrier metals 12 are polished and planarized using the CMP method, in such a way as to leave only the portions in the grooves. At this time, the interlayer insulator 11 is flat, or takes on a depressed form due to a dishing. Also, as shown in FIG. 54, the first wiring layer 13 is of, for example, a form wherein it is depressed in the center.

Next, as shown in FIG. 17, the barrier metal 21, non-ohmic element (for example, a diode configured of a silicon semiconductor) 18, lower electrode 15, recording layer 16, upper electrode 17, and stopper layer 30 are deposited in order on the first wiring layer 13.

Next, as shown in FIG. 18, the laminated membranes are processed using the lithography and anisotropic RIE method, forming a plurality of pillar-shaped memory cells MC. At the time of performing the lithography for forming the pillar-shaped memory cell MC, the distance between the lower extreme of the memory cell MC and the first wiring layer 13 adjacent to the memory cell MC lessens due to a misalignment with the first wiring layer 13 occurring. Because of this, an operating characteristic deteriorates due to a parasitic capacity increasing, and furthermore, as an electrical field applied to the interlayer insulator increases, the memory cell MC and the first wiring layer 13 adjacent thereto short-circuit due to a dielectric breakdown. Therein, in this embodiment, when etching the memory cell MC into the pillar shape, the etching is carried out for longer than an etching time taken to separate the barrier metal 21.

Figure 56:
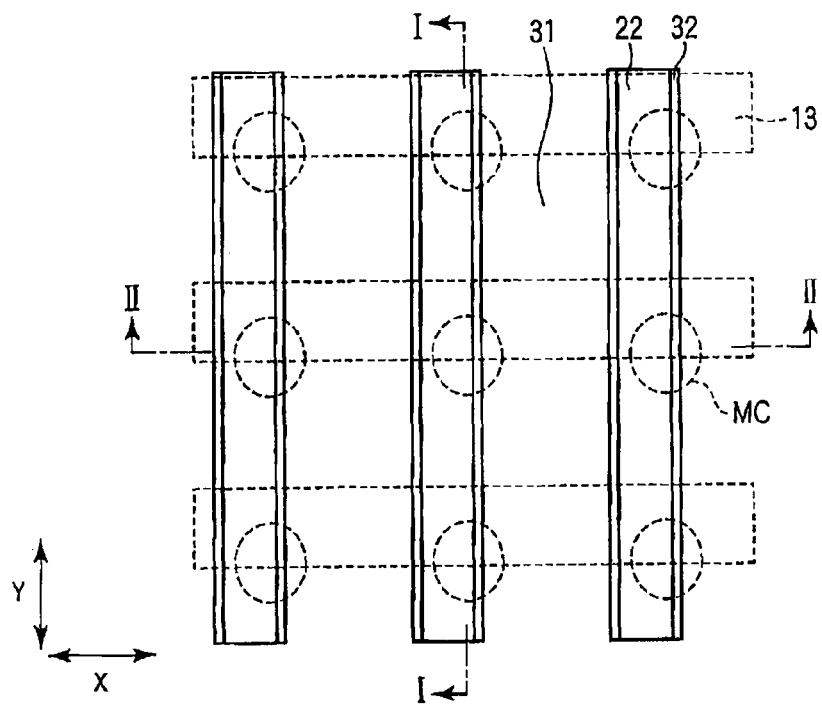
FIG. 56 is a perspective view showing the configuration of the resistance variation type memory in a case in which a misalignment of the memory cell and wiring layer has occurred.
Figure 57:
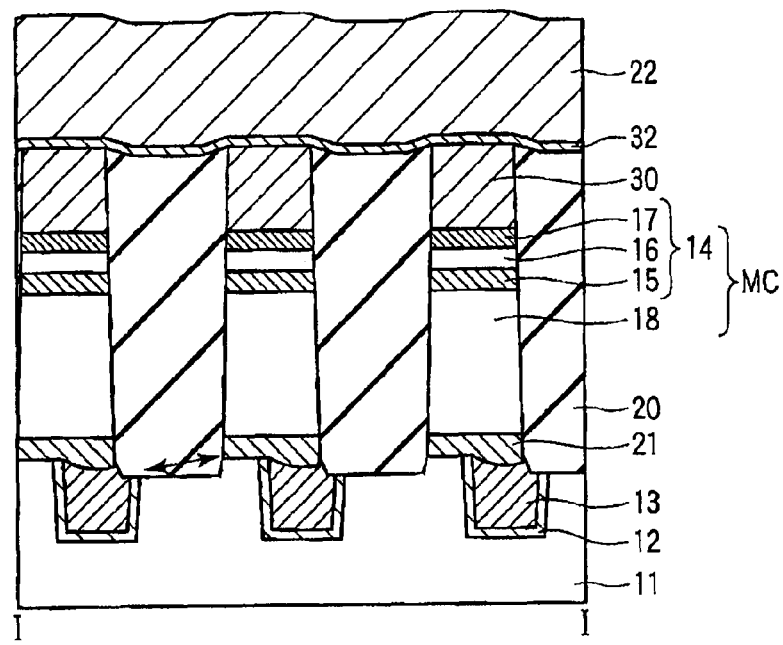
FIG. 57 is a sectional view showing a configuration of a resistance variation type memory along a line I-I shown in FIG. 56.
Figure 58:
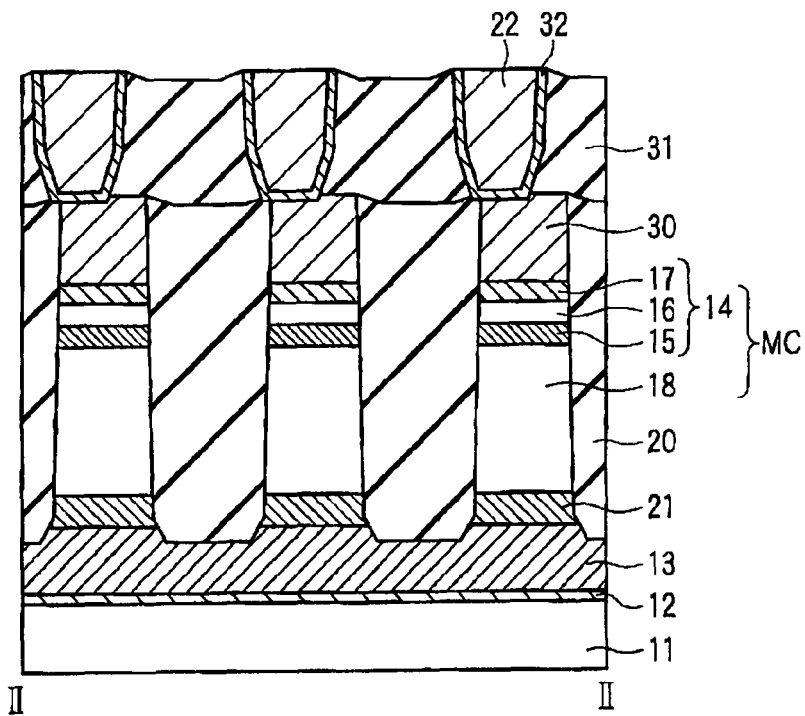
FIG. 58 is a sectional view showing the configuration of the resistance variation type memory along a line II-II shown in FIG. 56.

FIG. 56 is a plan view showing a configuration of a resistance variation type memory in a case in which a misalignment of the memory cell and wiring layer has occurred. FIG. 57 is a sectional view showing the configuration of the resistance variation type memory along the line I-I shown in FIG. 56. FIG. 58 is a sectional view showing the configuration of the resistance variation type memory along the line II-II shown in FIG. 56.

As shown in FIG. 57, due to overetching the barrier metal 21, the etching is performed as far as the interlayer insulator 11, first wiring layer 13, and barrier metal 12. Because of this, in the event of a misalignment occurring, it is also possible to etch the upper extreme of the wiring layer adjacent to the memory cell MC. For this reason, it is possible to increase the distance between the memory cell MC (specifically, the barrier metal 21) and the first wiring layer 13 and barrier metal 12 adjacent thereto. By this means, compared with a case in which the etching is not performed as far as the first wiring layer 13 and barrier metal 12, it is possible to reduce the electrical field applied to the interlayer insulator.

Also, a portion of an upper portion of the first wiring layer 13 which, due to overetching the barrier metal 21, is not in contact with the memory cell MC is formed low so as to be self-aligning, and this depressed portion is filled with the interlayer insulator 20. In other words, the top surface of the portion of the upper portion of the first wiring layer 13 which is not in contact with the memory cell MC is lower than the interface of the first wiring layer 13 and memory cell MC (specifically, the barrier metal 21). For the same kind of reason, the top surface of the interlayer insulator 11 between the memory cells MC is lower than the interface of the first wiring layer 13 and memory cell MC (specifically, the barrier metal 21).

Next, as shown in FIG. 19, the interlayer insulator 20 made of, for example, silicon oxide or silicon nitride is embedded on the first wiring layers 13, and between the memory cells MC, until it reaches the top surface of the stopper layer 30. Then, using the stopper layer 30 as a stopper, the top surface of the interlayer insulator 20 is planarized using a CMP method. By this means, as shown in FIG. 54, the interlayer insulator 20 is in contact with the side surfaces of the stopper layer 30, and its top surface is flat, or takes on a dishing form.

Next, as shown in FIG. 58, the interlayer insulator 31 made of, for example, silicon oxide or silicon nitride is deposited on the interlayer insulator 20 and stopper layer 30. Next, a plurality of second wiring layers 22 are formed in the interlayer insulator 31, using the damascene method. That is, grooves exposing the top surface of the stopper layer 30 are formed in the interlayer insulator 31, using the lithography and RIE method. The barrier metal 32 is deposited to a thickness of 2 to 50 nm in the grooves, using the CVD method, and next, the second wiring layer 22 is deposited to a thickness of 50 to 500 nm, using the CVD method.

At this time, due to a misalignment at the time of performing the lithography, the distance between the upper extreme of the pillar-shaped memory cell MC and a lower extreme of the second wiring layer 22 adjacent thereto lessens. Because of this, the operating characteristic deteriorates due to the parasitic capacity increasing, and furthermore, as the electrical field applied to the interlayer insulator 20 increases, the memory cell MC and the second wiring layer 22 adjacent thereto short-circuit due to a dielectric breakdown. Therein, in this embodiment, as shown in FIG. 58, by changing etching conditions partway through the etching of the interlayer insulator 31, the width of the groove is made smaller at a lower extreme by making an angle in an upper portion of an etching surface of the interlayer insulator 31 greater than in a lower portion. In this way, a two level tapered shape is applied to the second wiring layer 22 embedded in the groove. The side walls on both sides of the second wiring layer 22 take on a protruding form.

In order to create the two level tapered shape, in a case in which the interlayer insulator 31 is, for example, a single layer of silicon oxide, firstly, using an etching gas in which oxygen is added to a mixed gas of octafluorocyclobutane and argon, the interlayer insulator 31 is processed approximately vertically, creating an upper portion tapered shape. Then, by changing an oxygen partial pressure from partway through the etching process, the interlayer insulator 31 is processed, creating a lower portion tapered shape with an angle of taper smaller than that of the upper portion. Furthermore, as a method of creating the two level tapered shape in the interlayer insulator 31, it is also possible to use a method whereby another gas is added, a method whereby a condition such as an etching power, a gas partial pressure ratio, or pressure is changed, or the like.

Alternatively, the interlayer insulator 31 is made a two layer structure wherein a lower layer is a silicon nitride membrane, while an upper layer is of silicon oxide. Then, using an etching gas in which oxygen is added to a mixed gas of octafluorocyclobutane and argon, in the same way as heretofore described, the silicon oxide upper layer of the interlayer insulator 31 is processed approximately vertically. Subsequently, the etching gas is switched to carbon hydro-trifluoride, and the silicon nitride membrane lower layer of the interlayer insulator 31 is processed, creating the tapered shape of the lower portion.

By this means, it is possible to widen the distance between the pillar-shaped memory cell MC (specifically, the stopper layer 30) and the second wiring layer 22 adjacent thereto. For this reason, it being possible to increase the sectional area of the second wiring layer 22 while reducing the electrical field applied to the interlayer insulator, it is possible to reduce the resistance of the second wiring layer 22.

Figure 59:
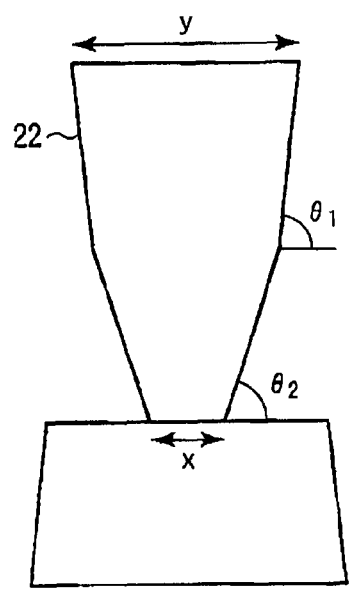
FIG. 59 is a sectional view showing the second wiring layer 22 extracted.
Figure 60:
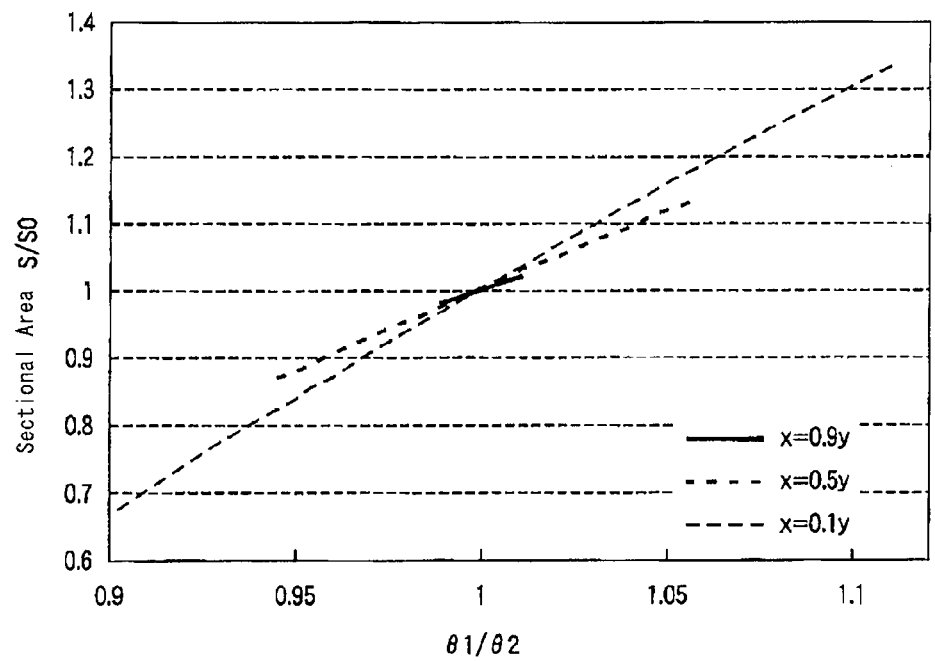
FIG. 60 is a graph showing a relationship between the sectional area and the angle of taper of the second wiring layer 22.

FIG. 59 is a sectional view showing the second wiring layer 22 extracted. FIG. 60 is a graph showing a relationship between the sectional area and the angle of taper of the second wiring layer 22. The angle of taper of the upper portion of the second wiring layer 22 (a first etching angle) is taken as $\theta 1$, the angle of taper of the lower portion of the second wiring layer 22 (a second etching angle) as $\theta 2$, the width of the upper extreme of the second wiring layer 22 as y, the width of the lower extreme of the second wiring layer 22 as x, a sectional area when changing the angle of taper from a half of the depth of the second wiring layer 22 (that is, the sectional area of the second wiring layer 22 having the two level tapered shape) as S, and the sectional area of a wiring layer having a one level tapered shape as SO. The vertical axis of FIG. 60 being a value S/SO of the two level taper sectional area S divided by the one level taper sectional area SO, and the horizontal axis is a value $\theta 1/\theta 2$ of the first etching angle $\theta 1$ divided by the second etching angle $\theta 2$. Also, in FIG. 60, the graph is drawn for three conditions: "x=0.9y", "x=0.5y", and "x=0.1y".

As is understood from FIG. 60, the larger the first etching angle $\theta 1$ is made in comparison with the second etching angle $\theta 2$, the larger it is possible to make the sectional area of the second wiring layer 22. That is, supposing that the width y of the upper extreme of the second wiring layer 22 is limited by, for example, a lithography, and the width x of the lower extreme of the second wiring layer 22 is determined by the area of contact between the second wiring layer 22 and the pillar-shaped memory cell MC, it is possible to increase the sectional area S further with a wiring having a two level angle of taper wherein $\theta 1>\theta 2$, as in FIG. 59, than with a wiring with a single angle of taper $\theta 1$.

Herein, in order to further increase the sectional area S of the second wiring layer 22, it is desirable to take a range of, for example, 88 to 90 degrees as $\theta 1$, and to take a range of, for example, 80 to 87 degrees as θ2. By making the second wiring layer 22 the kind of shape shown in FIG. 58, it is possible to reduce the resistance of the second wiring layer 22, and widen a circuit operation margin. In this embodiment, the second wiring layer 22 and stopper layer 30 being a contact of metal on metal, even in the event of reducing θ2, reducing the width x of the lower extreme of the second wiring layer 22, it does not constitute a big problem, because the serial resistance of the semiconductor 18 is high.

Lastly, the second wiring layer 22 and barrier metal 32 are polished and planarized using the CMP method, in such a way as to leave only the portions in the grooves. At this time, the interlayer insulator 31 is flat, or takes on a depressed form due to a dishing.

In the way heretofore described in detail, in this embodiment, by overetching the lowermost layer (the barrier metal 21 in this embodiment) of the laminated membranes deposited on the first wiring layer 13 when processing the memory cell MC into the pillar shape, it is possible to remove a portion of the upper portion of the first wiring layer 13 which is in proximity to the memory cell MC adjacent to the first wiring layer 13.

Consequently, according to this embodiment, it is possible to increase the distance between the pillar-shaped memory cell MC (specifically, the barrier metal 21), and the first wiring layer 13 and barrier metal 12 adjacent thereto. By this means, as it is possible to reduce the parasitic capacity, it is possible to prevent the deterioration of the operating characteristic. Furthermore, it is possible to reduce the electrical field applied to the interlayer insulator between the memory cell MC and the first wiring layer 13 adjacent thereto. As a result, as it is possible to prevent a dielectric breakdown of the interlayer insulator, it is possible to prevent the memory cell MC and the first wiring layer 13 adjacent thereto from short-circuiting.

Also, in this embodiment, by making the angle of the etching surface of the lower portion of the interlayer insulator 31 greater than that of the upper portion in the damascene process forming the second wiring layer 22 in the interlayer insulator 31, the width of the groove for the second wiring layer 22 becomes less at the lower extreme. By this means, a two level tapered shape is applied to the second wiring layer 22 embedded in the groove.

Consequently, according to this embodiment, it is possible to widen the distance between the pillar-shaped memory cell MC (specifically, the stopper layer 30), and the second wiring layer 22 adjacent thereto. By this means, as it is possible to reduce the parasitic capacity, it is possible to prevent the deterioration of the operating characteristic. Furthermore, it is possible to reduce the electrical field applied to the interlayer insulator between the memory cell MC and the second wiring layer 22 adjacent thereto. As a result, as it is possible to prevent a dielectric breakdown of the interlayer insulator, it is possible to prevent the memory cell MC and the second wiring layer 22 adjacent thereto from short-circuiting. Also, as it is possible to increase the sectional area of the second wiring layer 22 while reducing the electrical field applied to the interlayer insulator, it is possible to reduce the wiring resistance. These advantages work more effectively accompanying a miniaturization of the memory cell array.

In this embodiment too, it is also acceptable to reverse the laminating order of the variable resistance element 14 and non-ohmic element 18. Also, in the same way as in the fourth embodiment or fifth embodiment, it is also possible to add the second memory cell on the first memory cell, while sharing the wiring.

Modification Example

Figure 61:
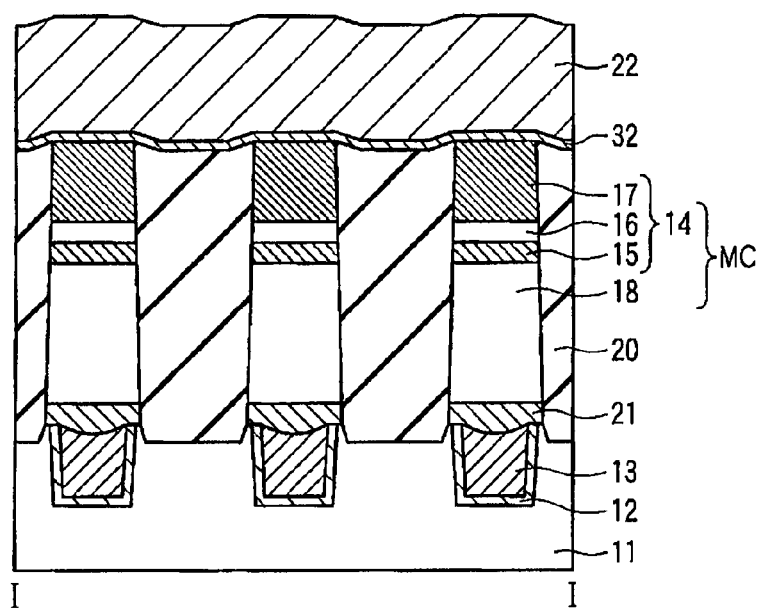
FIG. 61 is a sectional view showing a configuration of the resistance variation type memory according to the modification example along the line I-I.
Figure 62:
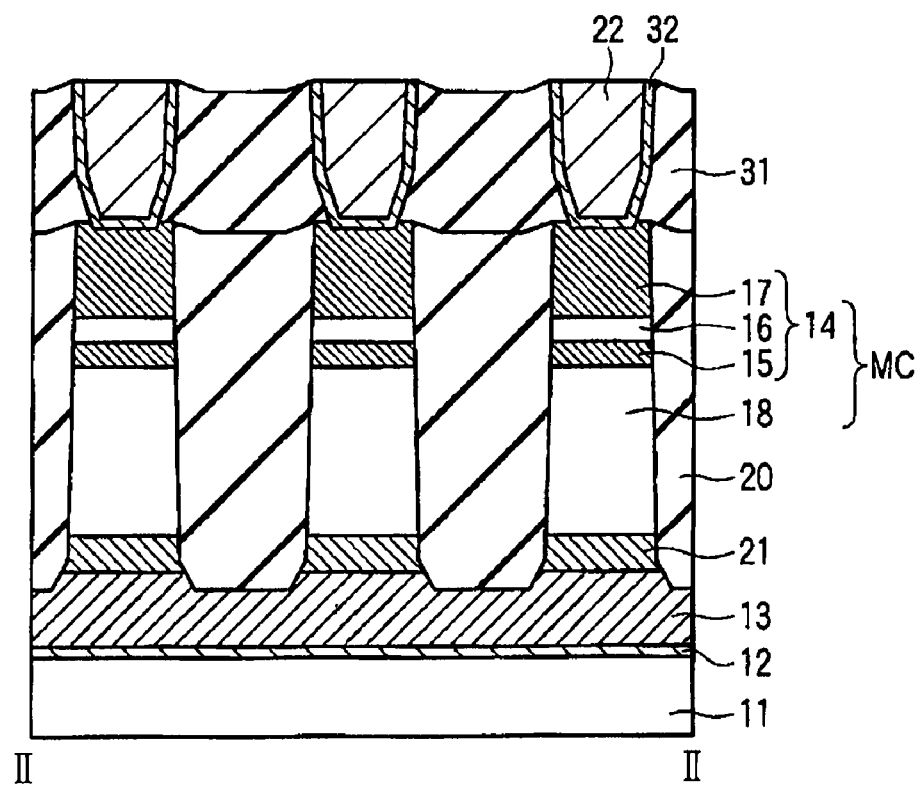
FIG. 62 is a sectional view showing a configuration of the resistance variation type memory according to the modification example along the line II-II.

As shown as the modification examples in the embodiments thus far, it is also acceptable to replace the CMP stopper layer 30 with the upper electrode 17. A plan view of a resistance variation type memory according to this modification example is the same as FIG. 53. FIG. 61 is a sectional view showing a configuration of the resistance variation type memory according to the modification example along the line I-I. FIG. 62 is a sectional view showing the configuration of the resistance variation type memory according to the modification example along the line II-II.

In this modification example, the CMP stopper layer 30 shown in FIG. 54 is omitted. Then, as shown in FIG. 61, by depositing the upper electrode 17 included in the variable resistance element 14 more thickly than in FIG. 54, the upper electrode 17 is given a role as an interlayer insulator 20 CMP stopper. As a material of this kind of upper electrode 17, titanium nitride, titanium aluminum nitride, tantalum nitride, tungsten nitride, or the like, is proposed.

Apart from omitting the CMP stopper layer 30, and depositing the upper electrode 17 thickly, a manufacturing method of the modification example is the same as that of the sixth embodiment. Consequently, with the modification example, it is possible to omit the process of depositing the material configuring the CMP stopper layer 30, and the etching process. Also, as it is possible to make the thickness of the upper electrode 17 of FIG. 61 less than the combined thickness of the upper electrode 17 and stopper layer 30 of FIG. 54, it is possible to further reduce the aspect ratio. In a structure in which the laminating order of the variable resistance element 14 and non-ohmic element 18 is reversed, it is possible to replace the CMP stopper with the barrier metal 21.

Although, in each of the heretofore described embodiments, a CMP method is used in order to realize the planarization of the interlayer insulator, it is, of course, also acceptable to carry out the planarization using a reflow process or etchback process with a silicate glass such as BPSG, PSG, or BSG. As a method of forming the insulator, apart from a method of converting silicon into a silicon oxide membrane or silicon nitride membrane, there is also no objection to using a method whereby, for example, oxygen ions are implanted into deposited silicon, or a method whereby deposited silicon is oxidized.

Although, in each embodiment, a silicon substrate is proposed as the substrate, another single crystal semiconductor substrate including silicon, such as a silicon germanium mixed crystal, or a silicon germanium carbon mixed crystal, is also acceptable. Furthermore, it being possible to use a silicide or polycide, such as a silicon germanium mixed crystal, a silicon germanium carbon mixed crystal, titanium silicon, nickel silicon, cobalt silicon, tantalum silicon, tungsten silicon, or molybdenum silicon, or a metal such as titanium, aluminum, copper, titanium nitride, or tungsten, as the first wiring layer and second wiring layer, it is acceptable that they are polycrystals, and it is also acceptable to make them laminated structures. Also, it being acceptable to use amorphous silicon, amorphous silicon germanium, or amorphous silicon germanium carbon as a material of the diode, it is also acceptable to make it a laminated structure.

Also, in each embodiment, in order to form the densest memory cell array, the first wiring layer and second wiring layer are shown in an orthogonal relationship seen from above, but depending on a memory cell array pattern disposition, a diagonally intersecting relationship is also acceptable.

The invention not being limited to the heretofore described embodiments, it can also be embodied modifying components, without departing from the scope thereof. Also, it is possible to configure various inventions by an appropriate combination of a plurality of components disclosed in the embodiments. For example, it is acceptable to delete a number of components from all the components disclosed in the embodiments, and it is also acceptable to appropriately combine components of differing embodiments.

What is claimed is:

1. A semiconductor memory device comprising:
    a first wiring layer which is provided on a first insulator, and which extends in a first direction;
    a non-volatile memory cell which is provided in a pillar shape on the first wiring layer, and which includes a non-ohmic element and variable resistance element connected in series, wherein a resistance value of the variable resistance element changes in accordance with a voltage or current applied thereto;
    a barrier layer which is provided on the non-volatile memory cell, and which is configured in an in-plane direction;
    a second insulator which is provided on the first insulator, and which covers side surfaces of the memory cell, the barrier layer; and
    a second wiring layer which is provided directly on the barrier layer, and which extends in a second direction.

2. The semiconductor memory device according to claim 1, wherein a top surface of the second insulator being flat, a position of the top surface of the second insulator is the same as a position of a top surface of the barrier layer.

3. The semiconductor memory device according to claim 1, wherein the barrier layer is configured of a single layer.

4. The semiconductor memory device according to claim 1, wherein the barrier layer is selected from a group of titanium nitride, titanium aluminum nitride, tantalum nitride, and tungsten nitride.

5. The semiconductor memory device according to claim 4, wherein a top surface of the second insulator being flat, a position of the top surface of the second insulator is the same as a position of a top surface of the barrier layer.

6. The semiconductor memory device according to claim 4, wherein the barrier layer is configured of a single layer.

7. The semiconductor memory device according to claim 4, wherein side walls of the second wiring layer are of a protruding form.

8. The semiconductor memory device according to claim 4, wherein a top surface of a portion of an upper portion of the first wiring layer which is not in contact with the memory cell is lower than an interface between the first wiring layer and the memory cell.

9. A method for manufacturing a semiconductor memory device comprising:
    a step of forming a first wiring layer which extends in a first direction on a first insulator;
    a step of depositing a memory cell material, which configures a non-volatile memory cell including a non-ohmic element and variable resistance element connected in series, on the first wiring layer;
    a step of depositing a barrier layer on the memory cell material;
    a step of processing the memory cell material and barrier layer in such a way that the memory cell material takes on a pillar shape, forming the memory cell;
    a step of forming a second insulator on the first insulator in such a way as to cover side surfaces of the memory cell and barrier layer;
    a step of planarizing a top surface of the second insulator using the barrier layer as a stopper; and
    a step of forming a second wiring layer which extends in a second direction directly on the barrier layer.

10. The method according to claim 9, wherein a top surface of the second insulator being flat, a position of the top surface of the second insulator is the same as a position of a top surface of the barrier layer.

11. The method according to claim 9, wherein the barrier layer is configured of a single layer.

12. The method according to claim 9, wherein the barrier layer is selected from a group of titanium nitride, titanium aluminum nitride, tantalum nitride, and tungsten nitride.

13. The method according to claim 9, wherein side walls of the second wiring layer are of a protruding form.

14. The method according to claim 9, wherein a top surface of a portion of an upper portion of the first wiring layer which is not in contact with the memory cell is lower than an interface between the first wiring layer and the memory cell.

* * * * *